(12) United States Patent
Ueki et al.

(10) Patent No.: US 10,115,772 B2
(45) Date of Patent: Oct. 30, 2018

(54) SEMICONDUCTOR DEVICE AND MANUFACTURING METHOD THEREOF

(71) Applicant: RENESAS ELECTRONICS CORPORATION, Tokyo (JP)

(72) Inventors: Makoto Ueki, Tokyo (JP); Koji Masuzaki, Tokyo (JP); Takashi Hase, Tokyo (JP); Yoshihiro Hayashi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/334,846

(22) Filed: Oct. 26, 2016

(65) Prior Publication Data

US 2017/0133434 A1 May 11, 2017

(30) Foreign Application Priority Data

Nov. 11, 2015 (JP) .................................. 2015-221240

(51) Int. Cl.
| | | |
|---|---|---|
| *H01L 29/02* | (2006.01) | |
| *H01L 27/24* | (2006.01) | |
| *H01L 45/00* | (2006.01) | |

(52) U.S. Cl.
CPC ...... *H01L 27/2481* (2013.01); *H01L 45/1253* (2013.01); *H01L 45/146* (2013.01); *H01L 45/1625* (2013.01); *H01L 45/1633* (2013.01)

(58) Field of Classification Search
CPC . H01L 45/1253; H01L 45/145; H01L 45/146; H01L 45/1625; H01L 45/1633;

(Continued)

(56) References Cited

U.S. PATENT DOCUMENTS 7,473,950 B2 * 1/2009 Fournier ................. H01L 45/04
  257/295
8,436,331 B2 * 5/2013 Iwakaji ............... H01L 27/1021
  257/2

(Continued)

FOREIGN PATENT DOCUMENTS

| JP | 2009049183 A | * | 3/2009 | ............. H01L 27/10 |
|---|---|---|---|---|
| JP | 4960537 B1 | | 6/2012 | |
| JP | 5332149 B2 | | 11/2013 | |

OTHER PUBLICATIONS

See Office action Appendix for English translation of Detailed Description of Yamazaki et al, JP-2009-049183-A.*

*Primary Examiner* — Jami V Miller
(74) *Attorney, Agent, or Firm* — McDermott Will & Emery LLP

(57) ABSTRACT

A semiconductor device has a resistance change element that is high in the holding resistance of a low resistance (On) state while securing a memory window. In a resistance random access memory including selection transistors and resistance change elements coupled in series to the selection transistors, the resistance change element uses a lower electrode that applies a positive voltage when being transited to a high resistance (Off) state, an upper electrode that faces the lower electrode, and a resistance change layer that is sandwiched between the lower electrode and the upper electrode and that uses an oxide of transition metal. The resistance change layer contains nitrogen. The concentration of nitrogen on the lower electrode side is higher than that on the upper electrode side. The nitrogen in the resistance change layer exhibits a concentration gradient continuously declined from the lower electrode side to the upper electrode side.

18 Claims, 17 Drawing Sheets

(58) Field of Classification Search
CPC . H01L 27/2481; H01L 29/02; G11C 13/0002; G11C 13/0007
USPC .................................... 257/2–5, E29.002
See application file for complete search history.

(56) References Cited

U.S. PATENT DOCUMENTS

| | | | |
|---|---|---|---|
| 8,598,564 B2* | 12/2013 | Sakotsubo | G11C 13/0004 257/4 |
| 9,000,506 B2 | 4/2015 | Ninomiya et al. | |
| 9,099,645 B2* | 8/2015 | Miyagawa | H01L 45/1266 |
| 9,190,615 B2* | 11/2015 | Takaishi | H01L 45/04 |
| 2009/0154222 A1* | 6/2009 | Chien | G11C 11/14 365/148 |
| 2014/0284541 A1* | 9/2014 | Takaishi | H01L 45/04 257/4 |

* cited by examiner

FIG. 4A
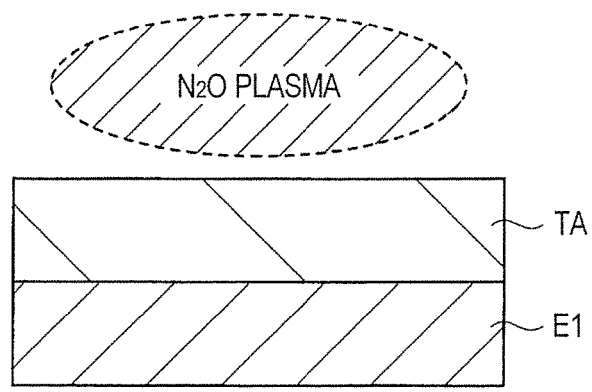
FIG. 4B
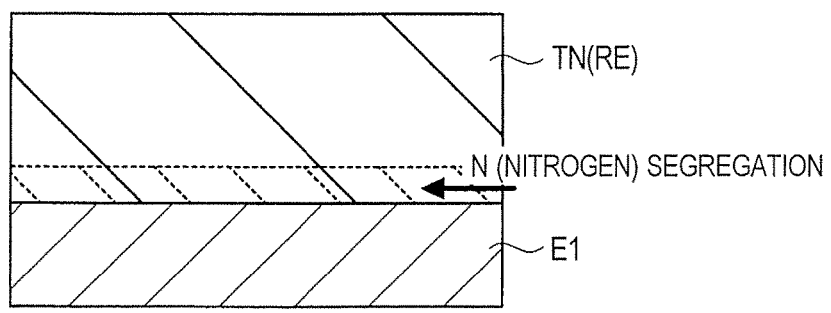

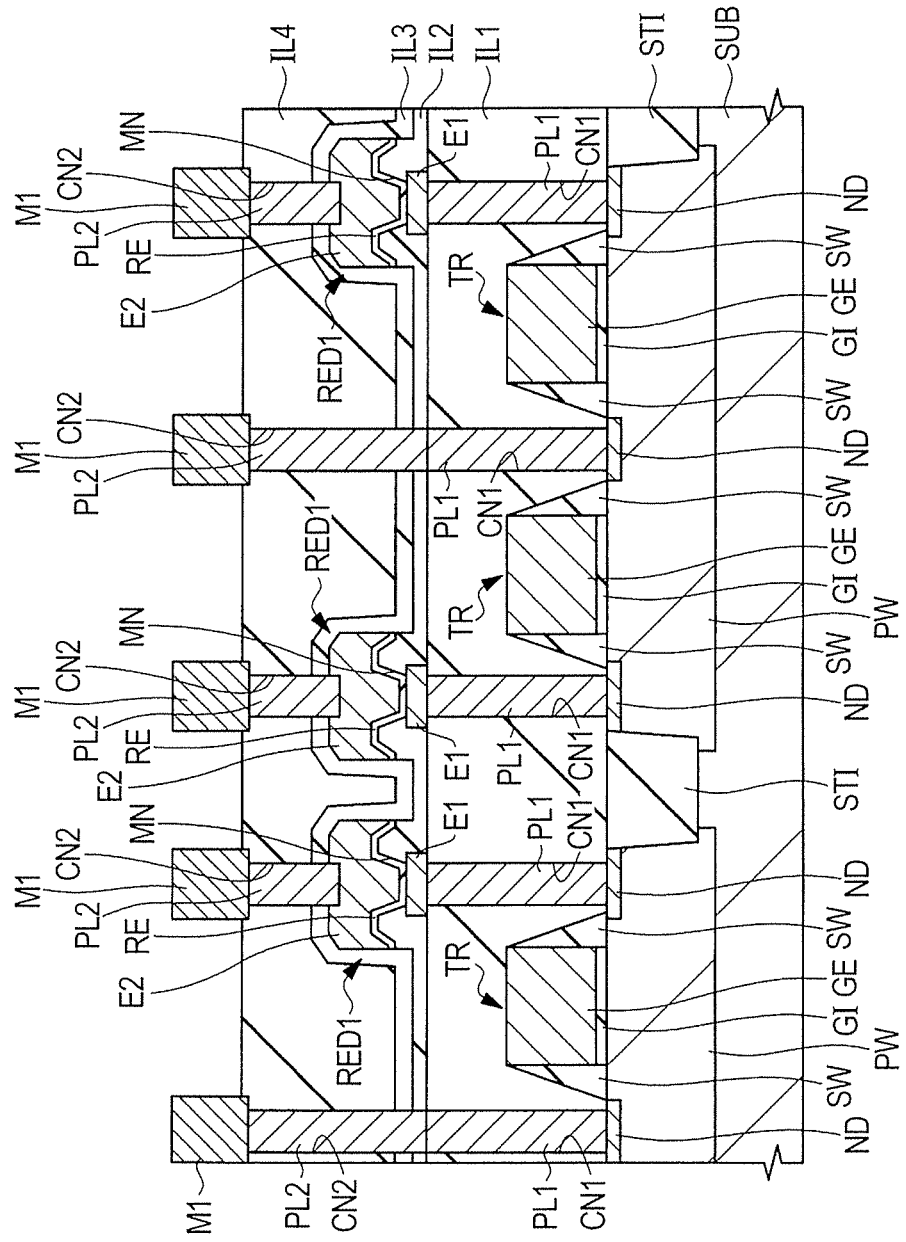

SEMICONDUCTOR DEVICE AND MANUFACTURING METHOD THEREOF

CROSS-REFERENCE TO RELATED APPLICATIONS

The disclosure of Japanese Patent Application No. 2015-221240 filed on Nov. 11, 2015 including the specification, drawings and abstract is incorporated herein by reference in its entirety.

BACKGROUND

The present invention relates to a semiconductor device and a manufacturing method thereof, and can be preferably used for a semiconductor device incorporating a resistance random access memory (ReRAM (Resistance Random Access Memory or Resistive Random Access Memory)) using a difference between a low resistance state and a high resistance state and for manufacturing thereof.

For example, Japanese Patent No. 4960537 describes a non-volatile memory element including a first electrode layer formed on a substrate, a resistance change layer arranged on the first electrode layer, and a second electrode layer arranged on the resistance change layer, and the resistance change layer has a two-layer structure in which an oxygen/nitrogen shortage tantalum oxynitride layer and a tantalum oxide layer are laminated.

Further, for example, Japanese Patent No. 5332149 describes a resistance change element having a resistance change film sandwiched between a pair of metal electrodes, and discloses that the resistance change film is a metal oxide film containing nitrogen atoms with a concentration of 1 atom % to 5 atom %.

SUMMARY

A resistance change element is a non-volatile memory element using a difference between the resistance values of a low resistance (On) state and a high resistance (Off) state. In general, in order to widen the memory window (the ratio of On-resistance to Off-resistance) of the resistance change element, it is effective that Off-writing conditions are increased to make Off-resistance higher. However, in the case where the Off-writing conditions are increased, the holding resistance of the low resistance (On) state after being switched to the low resistance (On) state tends to be deteriorated thereafter.

The other objects and novel features will become apparent from the description of the specification and the accompanying drawings.

A semiconductor device according to an aspect of the present invention includes a resistance random access memory in which selection transistors and resistance change elements that are coupled in series to the selection transistors are arranged over a semiconductor substrate. The resistance change element is configured using a lower electrode that applies a positive voltage when being transited to a high resistance state, an upper electrode that faces the lower electrode, and a resistance change layer that is sandwiched between the lower electrode and the upper electrode and is configured using an oxide of transition metal. In addition, the resistance change layer contains nitrogen, and the concentration of nitrogen on the lower electrode side is higher than that on the upper electrode side. The nitrogen contained in the resistance change layer exhibits a concentration gradient that is continuously declined from the lower electrode side to the upper electrode side.

According to an aspect of the present invention, it is possible to provide a semiconductor device having a resistance change element that is high in the holding resistance of a low resistance (On) state while securing a memory window.

BRIEF DESCRIPTION OF THE DRAWINGS

FIGS. 4A and 4B are cross-sectional views of main parts each showing a manufacturing method of the resistance change element according to the first embodiment;

FIG. 5 is a cross-sectional view of main parts for showing a semiconductor device having the resistance change element according to the first embodiment;

DETAILED DESCRIPTION

Figure 1:
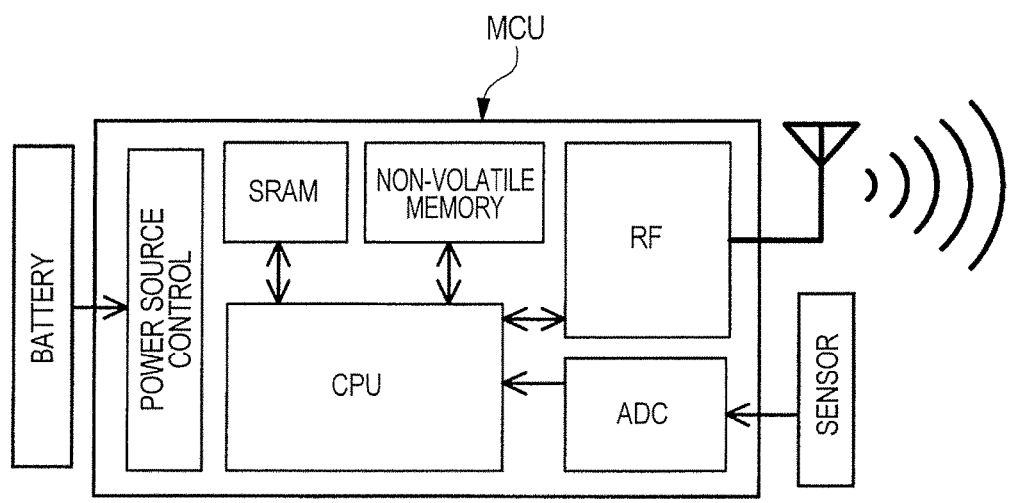
FIG. 1 is a block diagram of a wireless terminal configuring a sensor network according to a first embodiment.

The present invention will be described in the following embodiments while being divided into a plurality of sections or embodiments if necessary for convenience sake. However, except for a case especially specified, the sections or embodiments are not irrelevant to each other, and one has a relationship as a part of a modified example or an application or a complete modified example or application, or a detailed or supplementary explanation of the other. Further, if the specification refers to the number of elements (including the number of pieces, values, amounts, ranges, and the like) in the following embodiments, the present invention is not limited to the specific number, but may be smaller or larger than the specific number, except for a case especially specified or a case obviously limited to the specific number in principle.

Furthermore, the components (including elemental steps and the like) are not necessarily essential in the following embodiments, except for a case especially specified or a case obviously deemed to be essential in principle. Likewise, if the specification refers to the shapes or positional relationships of components in the following embodiments, the present invention includes those that are substantially close or similar to components in shapes and the like, except for a case especially specified or a case obviously deemed not to be close or similar in principle. The same applies to the number (including the number of pieces, values, amounts, ranges, and the like).

Hereinafter, the embodiments will be described in detail on the basis of the drawings. It should be noted that the same or relevant signs are given to members having the same functions in all the drawings for explaining the embodiments, and the repeated explanations thereof will be omitted. Further, if a plurality of similar members (regions) exists, an individual or specific region is shown in some cases by adding a symbol to a general sign. Further, in the following embodiments, the explanations of the same or similar components will not be repeated in principle if not necessary.

Further, in the drawings used in the embodiments, hatchings will be omitted in some cases even in the case of cross-sectional views in order to easily view the drawings. Further, in the cross-sectional views, the size of each region does not correspond to an actual device, but a specific region will be occasionally illustrated in a relatively large size in order to easily understand the drawings.

(Detailed Description Of Problems)

Japanese Patent No. 4960537 describes a resistance change layer having a two-layer structure in which an oxygen/nitrogen shortage tantalum oxynitride layer and a tantalum oxide layer are laminated. The resistance change layer is sandwiched between a first electrode layer in contact with the oxygen/nitrogen shortage tantalum oxynitride layer and a second electrode layer in contact with the tantalum oxide layer. When a positive voltage is applied to the second electrode layer, a resistance change element is changed from a low resistance (On) state to a high resistance (Off) state.

It is possible to suppress the deterioration of the oxygen concentration profile of the resistance change layer due to a thermal budget during a manufacturing process by using the oxygen/nitrogen shortage tantalum oxynitride layer.

On the other hand, the tantalum oxide layer containing no nitrogen is in contact with the second electrode layer to which a positive voltage is applied when being transited to the high resistance (Off) state. Therefore, when an Off-operation and an On-operation are repeated, oxygen ions are attracted to the second electrode layer to which a positive voltage is applied at the time of the Off-operation. Accordingly, oxygen is likely to be accumulated in the tantalum oxide layer near the second electrode layer.

After the transition to the low resistance (On) state, oxygen that is high in reactivity is present in the tantalum oxide layer near the second electrode layer. When the oxygen reacts with the oxygen shortage of a filament, there is a concern that the filament becomes thinner and the On-resistance is increased. Namely, it is conceivable that there is a problem in terms of the stability of keeping the low resistance (On) state.

Japanese Patent No. 5332149 describes a resistance change film that is configured using a metal oxide film containing nitrogen atoms with a concentration of 1 atom % to 5 atom %. Further, described is a method of forming the resistance change film by implanting nitrogen ions with a concentration of 1 atom % to 5 atom % into the metal oxide film. Further, Japanese Patent No. 5332149 describes that the formation of the resistance change film includes a process of forming the same using a reactive sputtering method by including nitrogen gas in a reaction atmosphere or a process of oxidizing after a metal nitride film is formed.

It is possible to reduce a forming voltage necessary for initializing the formation of a filament by using the resistance change film that is configured using a metal oxide film containing nitrogen atoms with a concentration of 1 atom % to 5 atom %. It is assumed that the forming voltage is reduced by flowing a current through electron potential (trap) formed by the nitrogen atoms contained in the metal oxide film.

On the other hand, there is a concern that a conductive path that couples an upper electrode to a lower electrode through the electron potential is formed due to the nitrogen atoms that are uniformly present in the resistance change film, and it is conceivable that there is a problem in terms of the stability of the Off-operation.

(First Embodiment)
<Wireless Terminal>

A micro controller unit (MCU) in which a non-volatile memory configured using a resistance change element according to a first embodiment is mounted will be described using FIG. 1. FIG. 1 is a block diagram of a wireless terminal configuring a sensor network according to the first embodiment. In the drawing, SRAM denotes a volatile semiconductor memory (Static Random Access Memory), CPU denotes a central processing unit, RF denotes a wireless transmission/reception circuit (Radio Frequency), and ADC denotes an analog to digital converter.

With the progress of IoT (Internet of Things) in which devices are connected to each other via the Internet, a highly-advanced sensor network technique has been required. A wireless terminal configuring the sensor network is configured using a sensor, radio waves, an MCU, and a power source such as a battery. However, the volume of data to be handled has been increased along with an increase in the number of sensing targets, and high-speed data processing capacity has been required. On the other hand, due to demand for downsizing and lightweight of a wireless terminal, it has been required to drive the wireless terminal with a button battery, and strong demand for low power consumption exists. A resistance random access memory using the resistance change element according to the first embodiment is applied to the non-volatile memory used in the MCU configuring such a wireless terminal.

As a data memory for data logging in the sensor network, the MCU in which the resistance random access memory is mixed is used. Accordingly, data can be rewritten with low power consumption and can be read at a high speed as compared to an MCU in which a flash memory is mixed. Thus, the sampling rate of data can be improved and long time use can be realized.

Further, random access on a bit basis cannot be performed in the MCU in which the flash memory is mixed. Therefore, when data is rewritten, a procedure of rewriting the data after being deleted all together on a block basis is necessary, and the rewriting takes much time. However, random access on a bit basis can be performed in the MCU in which the resistance random access memory is mixed, and thus data can be rewritten on a bit basis. For example, in the case of rewriting a program code via wireless communications (Over the Air), it is possible to meet the demand for frequent rewriting by using the resistance change element in which data can be rewritten by random access with low power consumption.

<Configuration of Resistance Change Element>

Figure 2:
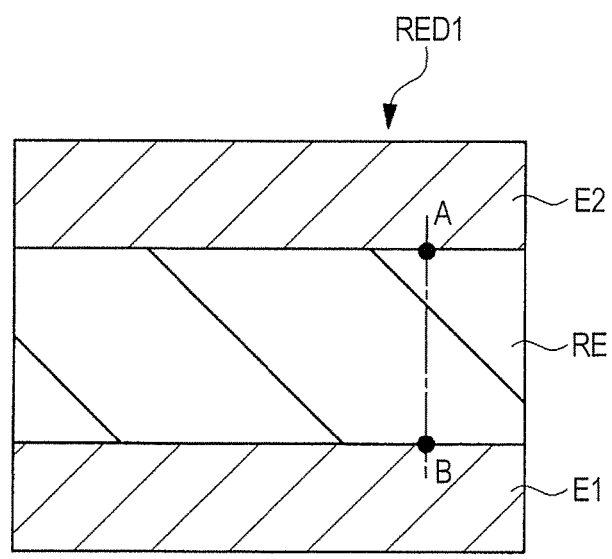
FIG. 2 is a cross-sectional view of main parts obtained by enlarging a part of a resistance change element according to the first embodiment.
Figure 3:
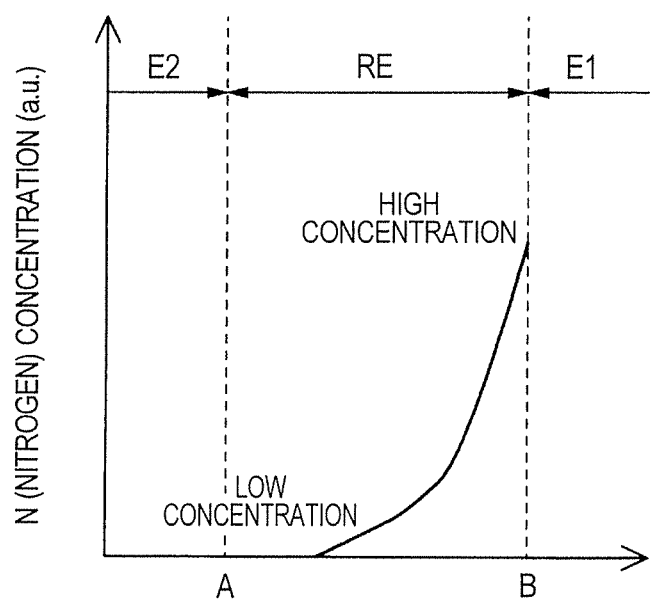
FIG. 3 is a graph for showing a nitrogen concentration profile in a resistance change layer according to the first embodiment.

A configuration of a resistance change element according to the first embodiment will be described using FIG. 2 and FIG. 3. FIG. 2 is a cross-sectional view of main parts obtained by enlarging a part of the resistance change element according to the first embodiment. FIG. 3 is a graph for showing a nitrogen concentration profile in a resistance change layer according to the first embodiment.

As shown in FIG. 2, a resistance change element RED1 is configured using a lower electrode E1, a resistance change layer RE, and an upper electrode E2.

The lower electrode E1 is an electrode on the side where a positive voltage is applied when being transited to the high resistance (OFF) state, and is made of, for example, precious metal (for example, Ru (ruthenium), Pt (platinum), Ir (iridium), Au (gold), palladium (Pd) or the like). Further, the lower electrode E1 may be of a single-layer structure, or a laminated structure in which different kinds of precious metal are laminated.

The resistance change layer RE is configured using an oxide of transition metal (for example, Ta (tantalum), Hf (hafnium), Al (aluminum), Ni (nickel), Ti (titanium), W (tungsten), or the like) containing N (nitrogen). Further, the concentration of N (nitrogen) contained in the resistance change layer RE is high on the lower electrode E1 side to which a positive voltage is applied when being transited to the high resistance (Off) state, and is low on the upper electrode E2 side facing the lower electrode E1.

In addition, as shown in FIG. 3, N (nitrogen) contained in the resistance change layer RE exhibits a concentration gradient that is continuously declined from the lower electrode E1 side to the upper electrode E2 side. N (nitrogen) may be segregated at the interface between the lower electrode E1 and the resistance change layer RE.

In the first embodiment, a TaOx (tantalum oxide) film containing N (nitrogen) is exemplified as the resistance change layer RE. The range of x of the TaOx (tantalum oxide) film containing N (nitrogen) is larger than 0 and equal to or smaller than 2.5 ($0<x\leq2.5$). As a representative value of x, 2.0 can be exemplified.

Therefore, the concentration of N (nitrogen) contained in the TaOx (tantalum oxide) film on the lower electrode E1 side to which a positive voltage is applied when being transited to the high resistance (Off) state is higher than that of N (nitrogen) contained in the TaOx (tantalum oxide) film on the upper electrode E2 side facing the lower electrode E1. In addition, N (nitrogen) contained in the TaOx (tantalum oxide) film exhibits a concentration gradient that is continuously declined from the lower electrode E1 side to the upper electrode E2 side. The concentration of N (nitrogen) at the interface between the resistance change layer RE and the upper electrode E2 may be 0 or not 0.

The upper electrode E2 is an electrode that faces the lower electrode E1 while sandwiching the resistance change layer RE, and is made of, for example, W (tungsten).

<Manufacturing Method of Resistance Change Element>

A manufacturing method of the resistance change element according to the first embodiment will be described using FIGS. 4A and 4B. FIGS. 4A and 4B are cross-sectional views of main parts each showing a manufacturing method of the resistance change element according to the first embodiment.

First, as shown in FIG. 4A, the lower electrode E1 made of, for example, precious metal (for example, Ru (ruthenium)) is formed.

Next, for example, a Ta (tantalum) film TA is formed on the lower electrode E1 by, for example, a sputtering method. The thickness of the Ta (tantalum) film TA is, for example, about 1.5 nm.

Next, as shown in FIG. 4B, the Ta (tantalum) film TA is changed to a TaOx (tantalum oxide) film (hereinafter, simply referred to as a TaON (tantalum oxynitride) film in the first embodiment) TN containing N (nitrogen) by plasma oxidation using $N_2O$ (nitrous oxide) gas. The TaON (tantalum oxynitride) film TN functions as the resistance change layer RE. The thickness of the TaON (tantalum oxynitride) film TN is, for example, about 3 nm.

In this case, N (nitrogen) in the TaON (tantalum oxynitride) film TN is differently introduced depending on the plasma oxidation conditions. When the temperature and power of the plasma oxidation conditions are changed, the amount of segregation of N (nitrogen) can be controlled on the surface of the lower electrode E1, namely, at the interface between the lower electrode E1 made of Ru (ruthenium) and the TaON (tantalum oxynitride) film TN. Specifically, N (nitrogen) is likely to be segregated at the interface between the lower electrode E1 and the TaON (tantalum oxynitride) film TN in the low temperature and high power conditions.

Further, the concentration of N (nitrogen) contained in the TaON (tantalum oxynitride) film TN is preferably equal to or larger than 3 atomic % and smaller than 20 atomic %, and the effect of the improvement of holding resistance in the low resistance (On) state can be expected. When the concentration of N (nitrogen) contained in the TaON (tantalum oxynitride) film TN becomes larger than 20 atomic %, an additional steady conductive path is formed in a filament. Accordingly, it is difficult to perform the Off-operation. When the concentration of N (nitrogen) becomes smaller than 3 atomic %, there is a possibility that the effect of the improvement of holding resistance in the low resistance (On) state cannot be expected.

Next, the upper electrode E2 made of, for example, W (tungsten) is formed on the TaON (tantalum oxynitride) film TN (resistance change layer RE) (see FIG. 2).

<Configuration of Semiconductor Device>

A configuration of a semiconductor device having the resistance change element according to the first embodiment will be described using FIG. 5. FIG. 5 is a cross-sectional view of main parts for showing a semiconductor device having the resistance change element according to the first embodiment. In this case, a memory cell is exemplified using a combination of one resistance change element and one semiconductor device as a unit cell. Further, for example, an n-channel MOSFET (Metal Oxide Semiconductor Field Effect Transistor) is exemplified as a selection transistor in the semiconductor device.

A semiconductor substrate SUB is separated into a plurality of element regions by separation parts STI. P-type wells PW famed by introducing, for example, p-type conductive impurities are formed on the semiconductor substrate SUB.

A gate electrode GE is formed on the p-type well PW through a gate insulating film GI. Side walls SW are formed on the side walls of the gate electrode GE, and n-type semiconductor regions ND formed by introducing, for example, n-type conductive impurities are formed in the p-type wells PW on the both sides of the gate electrode GE. The gate electrodes GE serve as word lines of selection transistors TR, and the n-type semiconductor regions ND function as the sources and drains of the selection transistors TR.

The selection transistor TR is covered with an insulating film IL1. A contact hole CN1 that vertically penetrates the insulating film IL1 to reach a necessary part such as the n-type semiconductor region ND is formed, and a plug PL1 made of, for example, W (tungsten) as a main conductive material is formed in the contact hole CN1.

The lower electrode E1 that is electrically coupled to one n-type semiconductor region ND of the selection transistor TR through the plug PL1 is famed on the insulating film IL1. The lower electrode E1 is configured using an Ru/Ta laminated film in which, for example, a Ta (tantalum) film is used for the lower layer and an Ru (ruthenium) film is used for the upper layer. The lower electrode E1 is covered with an insulating film IL2, and a memory hole MN that penetrates the insulating film IL2 to reach the lower electrode E1 is formed.

The resistance change layer RE is formed on the lower electrode E1, the upper electrode E2 is formed on the resistance change layer RE, and the resistance change element RED1 is configured using the lower electrode E1, the resistance change layer RE, and the upper electrode E2. The resistance change layer RE is formed in the inner wall (the side surfaces and the bottom surface) of the memory hole MN that is an opening of the insulating film IL2, and is in contact with the lower electrode E1 at the bottom surface of the memory hole MN. Further, the resistance change layer RE is formed so as to ride over the insulating film IL2 including the inner wall (the side surfaces and the bottom surface) of the memory hole MN.

In addition, the resistance change layer RE is configured using, for example, a TaON (tantalum oxynitride) film, and N (nitrogen) is segregated at the interface between the lower electrode E1 and the resistance change layer RE (see FIG. 2 and FIG. 3). The upper electrode E2 is configured using, for example, a W (tungsten) film. A TaN/Ta laminated film in which a Ta (tantalum) film is used for the lower layer and a TaN (tantalum nitride) film is used for the upper layer may be formed between the resistance change layer RE and the upper electrode E2.

The resistance change element RED1 is covered with a cover insulating film IL3 and an interlayer insulating film IL4. The cover insulating film IL3 is made of, for example, SiN (silicon nitride), SiON (silicon oxynitride), SiCN (carbon-containing silicon nitride), or the like, and the interlayer insulating film IL4 is made of, for example, SiO$_2$ (silicon oxide), SiOC (carbon-containing silicon oxide), or the like.

A contact hole CN2 that vertically penetrates the cover insulating film IL3 and the interlayer insulating film IL4 to reach the upper electrode E2 of the resistance change element RED1 is formed. Further, the contact hole CN2 that vertically penetrates the insulating film IL2, the cover insulating film IL3, and the interlayer insulating film IL4 to reach the plug PL1 that is electrically coupled to the other n-type semiconductor region ND of the selection transistor TR is formed.

A plug PL2 made of, for example, W (tungsten) as a main conductive material is formed in the contact hole CN2. A first-layer wiring M1 coupled to the plug PL2 is formed on the interlayer insulating film IL4. Further, another wiring (not shown) is formed on the first-layer wiring M1.

<Manufacturing Method of Semiconductor Device>

A manufacturing method of the semiconductor device having the resistance change element according to the first embodiment will be described in processing order using FIG. 6 to FIG. 12. FIG. 6 to FIG. 12 are cross-sectional views of main parts each showing a manufacturing process of the semiconductor device having the resistance change element according to the first embodiment, and show the same parts as FIG. 5.

Figure 6:
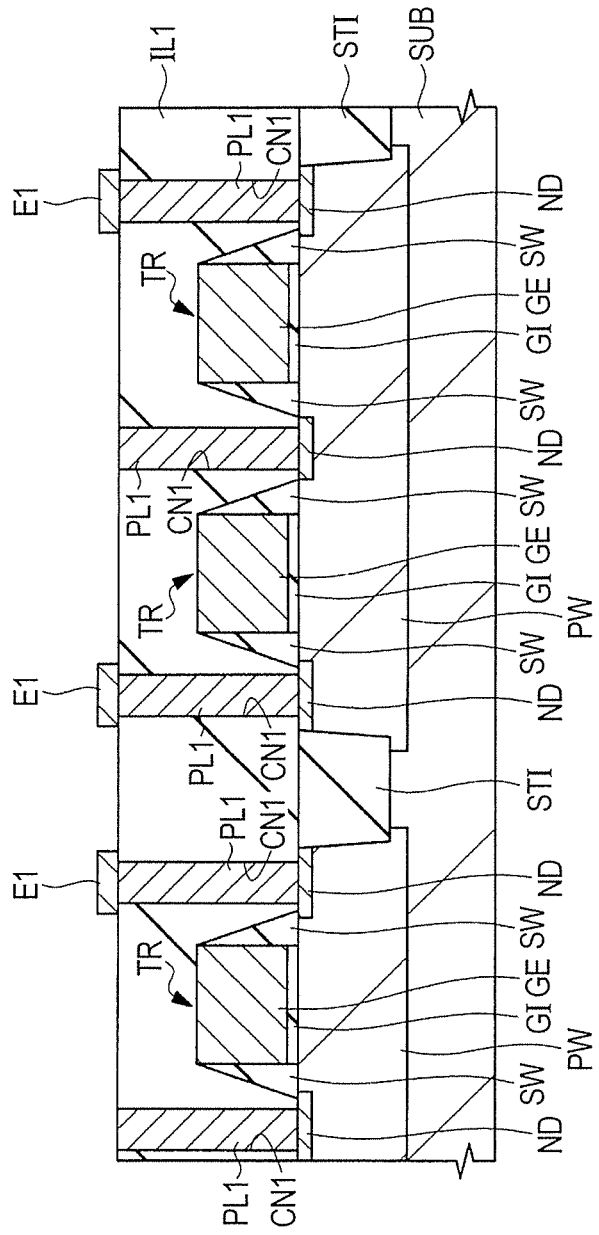
FIG. 6 is a cross-sectional view of main parts for showing a manufacturing process of the semiconductor device having the resistance change element according to the first embodiment.

First, as shown in FIG. 6, the semiconductor substrate (a semiconductor wafer formed into a circular thin plate) SUB made of, for example, p-type silicon single crystal is prepared. Next, the separation part STI that is configured using an insulating film is formed at an element separation region, and then the p-type well PW is formed by ion implantation of p-type conductive impurities (for example, B (boron)) is formed on the semiconductor substrate SUB.

Next, the gate insulating film GI and the gate electrode GE configuring the selection transistor TR are fainted, and further the side walls SW are formed on the side walls of the gate electrode GE. Next, the n-type semiconductor regions ND that function as the source and drain of the selection transistor TR are formed in the p-type wells PW on the both sides of the gate electrode GE by ion implantation of n-type conductive impurities (for example, P (phosphorus) or As (arsenic)) in a self-alignment manner relative to the gate electrode GE and the side walls SW.

Next, the insulating film IL1 is formed on the semiconductor substrate SUB so as to cover the gate electrode GE and the like, and then the contact hole CN1 is formed by processing the insulating film IL1 by etching using a resist pattern as a mask. The contact hole CN1 is formed on a necessary part such as the n-type semiconductor region ND. Next, the plug PL1 made of, for example, W (tungsten) as a main conductive material is formed in the contact hole CN1.

Next, the exposed surface of the plug PL1 is etched by Ar (argon) plasm, and then metallic material is formed by, for example, a sputtering method or a CVD (Chemical Vapor Deposition) method. The metallic material may be of a structure in which different kinds of metal are laminated. An Ru/Ta laminated film in which, for example, a Ta (tantalum) film is used for the lower layer and an Ru (ruthenium) film is used for the upper layer can be formed in a consistent vacuum process by, for example, a sputtering method. In this case, the Ta (tantalum) film serves as an adhesion layer, and the Ru (ruthenium) film serves as a layer of introducing different kinds of metal into the electrode and the resistance change layer RE of the resistance change element RED1.

Next, the metallic material is processed by etching using a resist pattern as a mask to form the lower electrode E1. The lower electrode E1 is formed on the plug PL1 that is electrically coupled to one n-type semiconductor region ND of the selection transistor TR, but is not formed on the plug PL1 that is electrically coupled to the other n-type semiconductor region ND of the selection transistor TR.

It should be noted that the metallic material may be processed by etching using an insulating film as a mask instead of the etching using a resist pattern as a mask. For example, an insulating film made of $SiO_2$ (silicon oxide) or SiN (silicon nitride), or configured using a laminated film thereof is formed on the metallic material, and then the insulating film is processed by etching using a resist pattern as a mask to form a lower electrode processing pattern configured using the insulating film on the metallic material. Thereafter, the metallic material is processed by etching using the lower electrode processing pattern as a mask to form the lower electrode E1.

Figure 7:
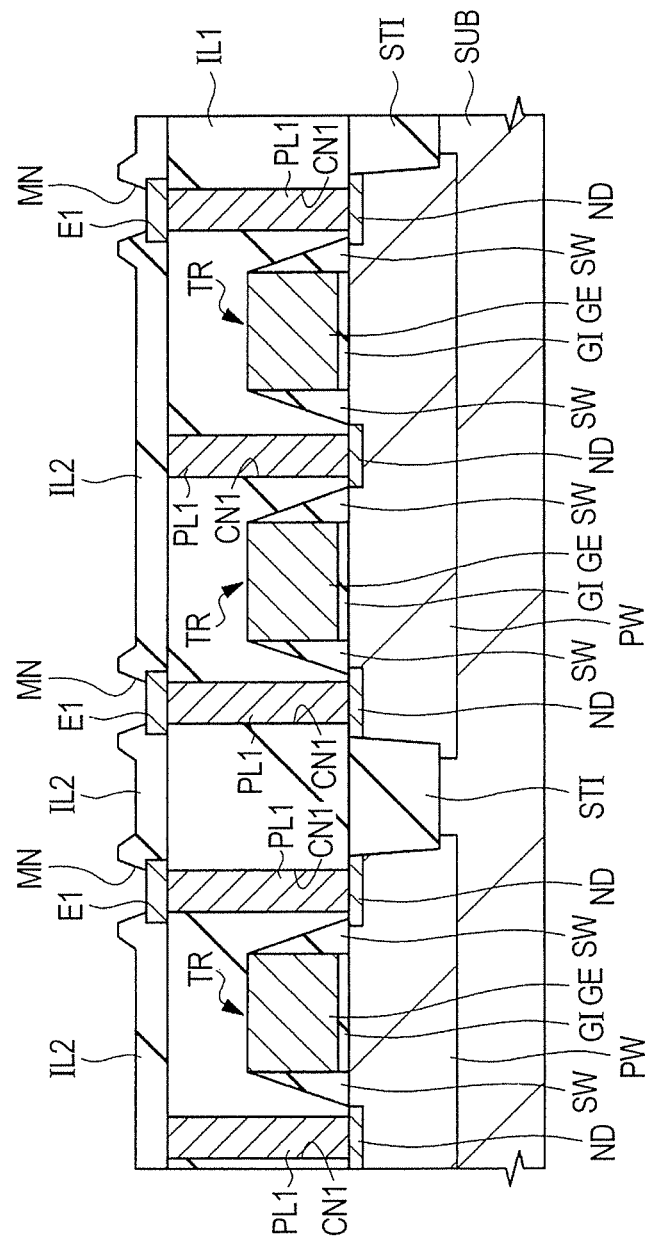
FIG. 7 is a cross-sectional view of main parts during the manufacturing process of the semiconductor device subsequent to FIG. 6.

Next, as shown in FIG. 7, the insulating film IL2 is formed on the insulating film IL1 by, for example, a CVD method so as to cover the lower electrode E1. For example, SiN (silicon nitride), SiON (silicon oxynitride), $SiO_2$ (silicon oxide), SiCN (carbon-containing silicon nitride), or the like is used for the insulating film IL2.

Next, the insulating film IL2 is processed by etching using a resist pattern as a mask to form the memory hole MN. An active region of the resistance change layer RE is defined by the memory hole MN.

Figure 8:
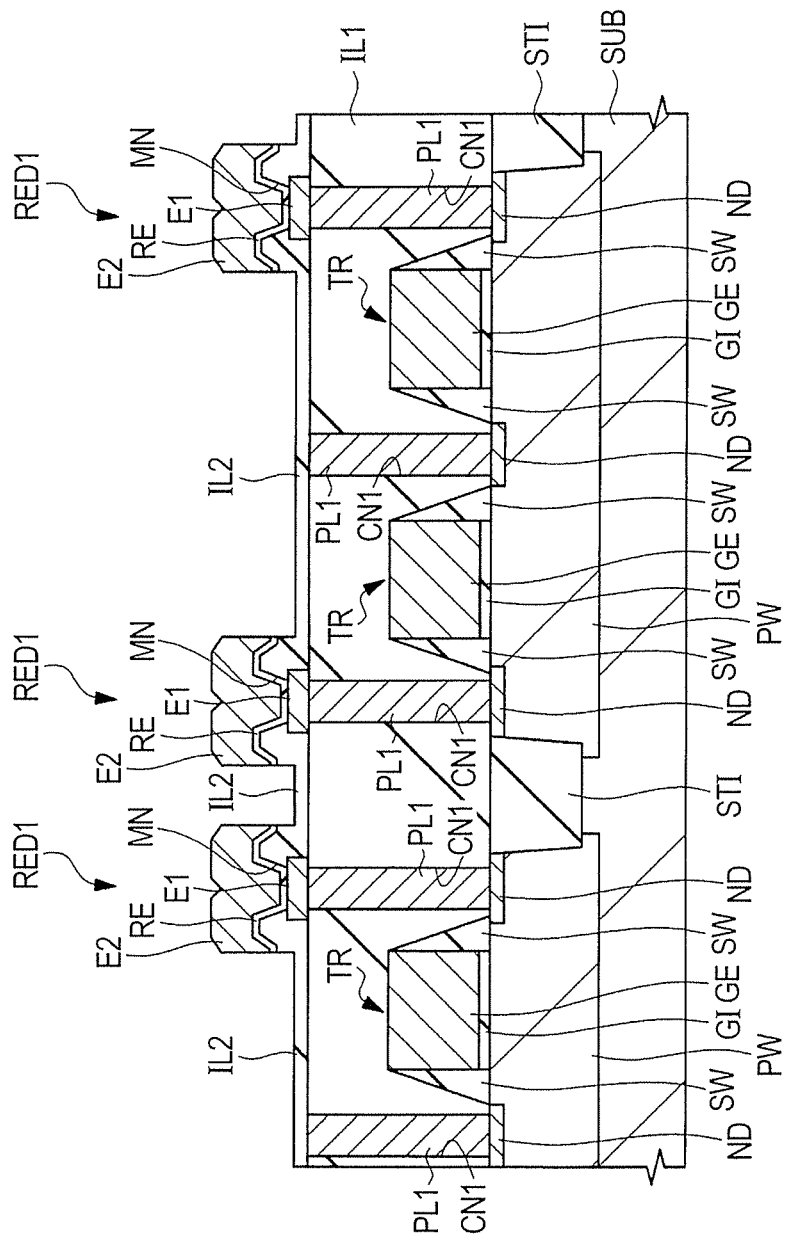
FIG. 8 is a cross-sectional view of main parts during the manufacturing process of the semiconductor device subsequent to FIG. 7.

Next, as shown in FIG. 8, the resistance change layer RE is formed. First, a Ta (tantalum) film is formed on the insulating film IL2 including the inner wall (the side surfaces and the bottom surface) of the memory hole MN by, for example, a sputtering method. The thickness of the Ta (tantalum) film is, for example, about 1.5 nm. Next, the Ta (tantalum) film is changed to a TaON (tantalum oxynitride) film by plasma oxidation using $N_2O$ (nitrous oxide) gas. The thickness of the TaON (tantalum oxynitride) film is, for example, about 3 nm.

In this case, N (nitrogen) in the TaON (tantalum oxynitride) film is differently introduced depending on the plasma oxidation conditions. When the temperature and power of the plasma oxidation conditions are changed, the amount of segregation of N (nitrogen) can be controlled on the surface of the lower electrode E1, or at the interface between the Ru (ruthenium) film and the TaON (tantalum oxynitride) film in the case of the lower electrode E1 that is configured using an Ru/Ta laminated film.

Next, in order to introduce an oxygen defect into the TaON (tantalum oxynitride) film, a Ta (tantalum) film is formed on the TaON (tantalum oxynitride) film by, for example, a sputtering method, and then a TaN (tantalum nitride) film is formed in a consistent vacuum process by, for example, a sputtering method. The TaN (tantalum nitride) film suppresses natural oxidation on the surface of the Ta (tantalum) film, and helps to efficiently introduce the oxygen defect into the TaON (tantalum oxynitride) film.

Next, a W (tungsten) film is formed on the TaN (tantalum nitride) film by, for example, a sputtering method or a CVD method.

Next, the W (tungsten) film, the TaN (tantalum nitride) film, the Ta (tantalum) film, and the TaON (tantalum oxynitride) film are sequentially processed by etching using a resist pattern as a mask. Accordingly, the upper electrode E2 configured using the W (tungsten) film as a main conductive material and the resistance change layer RE configured using the TaON (tantalum oxynitride) film are formed.

Figure 9:
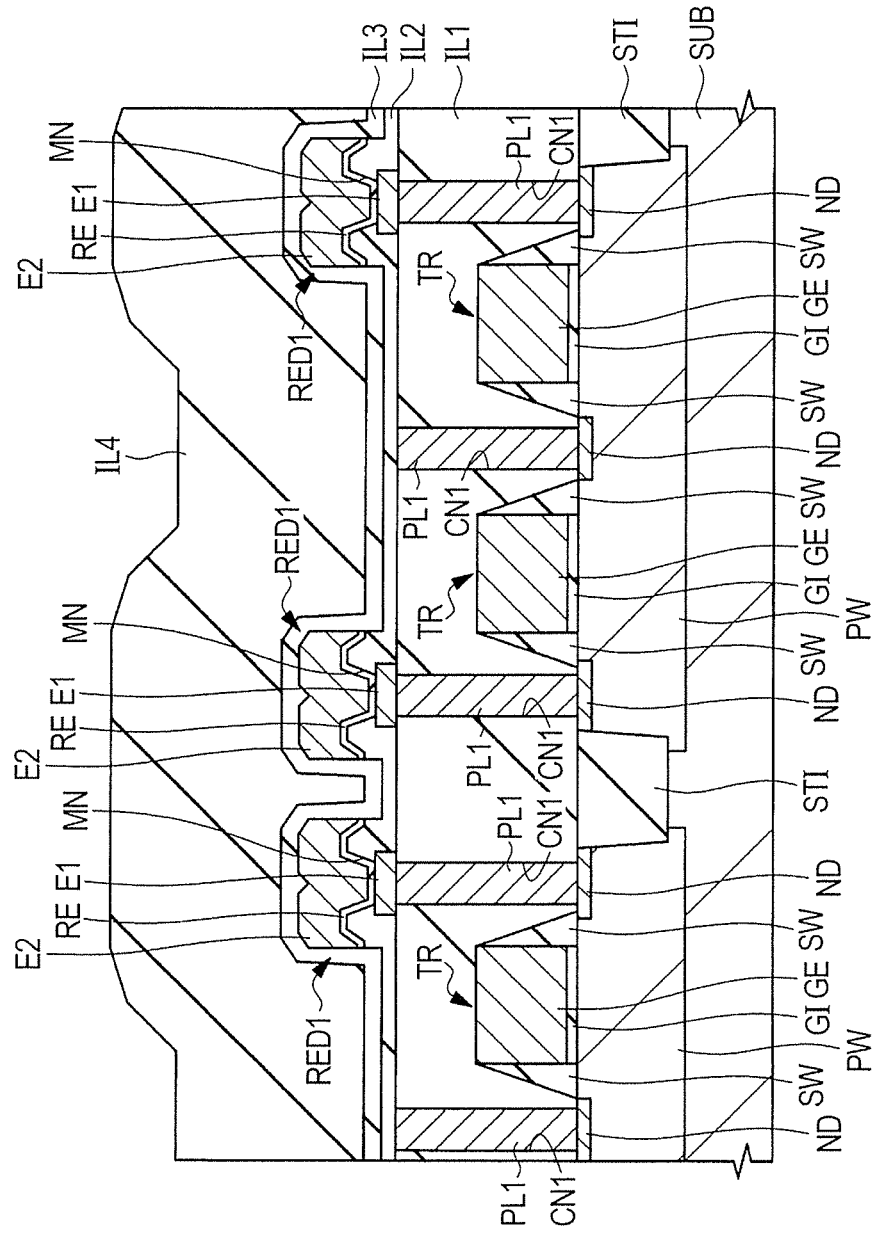
FIG. 9 is a cross-sectional view of main parts during the manufacturing process of the semiconductor device subsequent to FIG. 8.

Next, as shown in FIG. 9, the cover insulating film IL3 and the interlayer insulating film IL4 are sequentially formed on the insulating film IL2 so as to cover the upper electrode E2 and the resistance change layer RE by, for example, a CVD method. The cover insulating film IL3 is made of, for example, SiN (silicon nitride), SiON (silicon oxynitride), SiCN (carbon-containing silicon nitride), or the like, and the interlayer insulating film IL4 is made of, for example, $SiO_2$ (silicon oxide), SiOC (carbon-containing silicon oxide), or the like.

Figure 10:
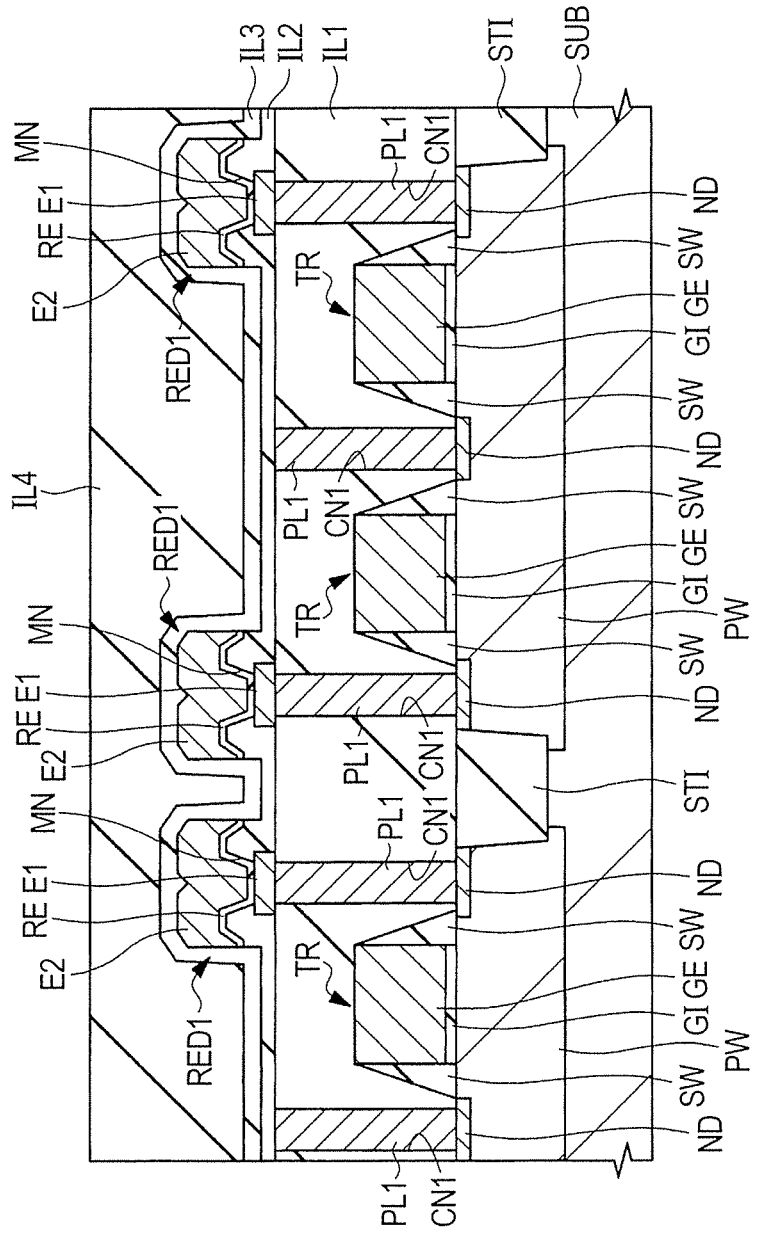
FIG. 10 is a cross-sectional view of main parts during the manufacturing process of the semiconductor device subsequent to FIG. 9.

Next, as shown in FIG. 10, the upper surface of the interlayer insulating film IL4 is ground and flattened by, for example, a CMP (Chemical Mechanical Polishing) method.

Figure 11:
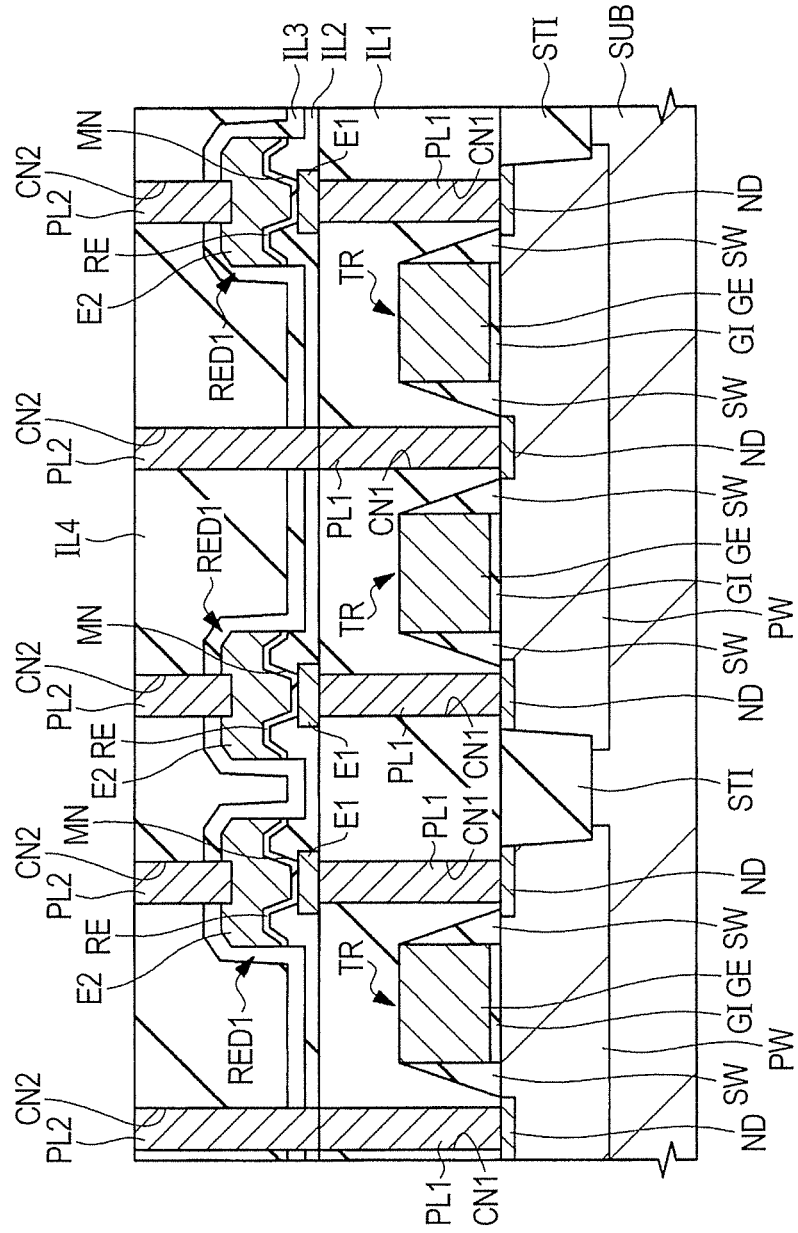
FIG. 11 is a cross-sectional view of main parts during the manufacturing process of the semiconductor device subsequent to FIG. 10.

Next, as shown in FIG. 11, the contact hole CN2 reaching the upper electrode E2 is formed in the cover insulating film IL3 and the interlayer insulating film IL4 by etching using a resist pattern as a mask, and at the same time, the contact hole CN2 reaching the plug PL1 that is electrically coupled to the other n-type semiconductor region ND of the selection transistor TR is formed in the insulating film IL2, the cover insulating film IL3, and the interlayer insulating film IL4. Next, a barrier metal film and a W (tungsten) film are formed on the interlayer insulating film IL4 including the inside of the contact hole CN2 by, for example, a CVD method, and then the barrier metal film and the W (tungsten) film other than the inside of the contact hole CN2 are removed by, for example, a CMP method. Accordingly, the plug PL2 made of W (tungsten) as a main conductive material is formed in the contact hole CN2.

Figure 12:
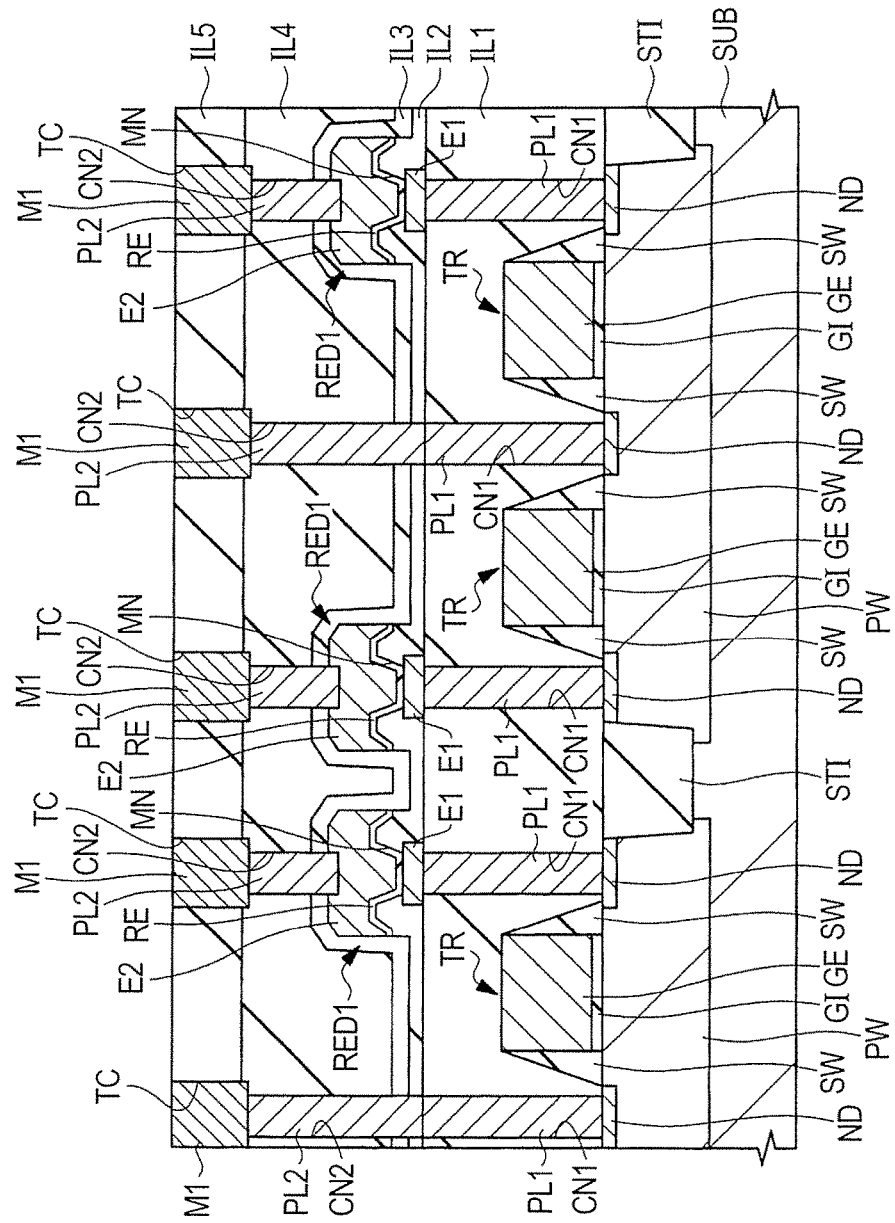
FIG. 12 is a cross-sectional view of main parts during the manufacturing process of the semiconductor device subsequent to FIG. 11.

Next, as shown in FIG. 12, the exposed surface of the plug PL2 is etched by Ar (argon) plasma, and a conductive film is formed by, for example, a sputtering method or a CVD method. The conductive film is a metal film composed mainly of any one of, for example, W (tungsten), Al (aluminum), Cu (copper), and the like. Next, the conductive film is processed by etching using a resist pattern as a mask to form the first-layer wiring M1 coupled to the plug PL2.

The first-layer wiring M1 may be formed by a damascene process. For example, after an insulating film IL5 is formed on the interlayer insulating film IL4 and the plug PL2, a wiring groove TC is formed at a predetermined region of the insulating film IL5 by etching using a resist pattern as a mask so that the upper surface of the plug PL2 is exposed. Next, a barrier metal film is formed on the insulating film IL5 including the inner wall (the side surfaces and the bottom surface) of the wiring groove TC. Next, a Cu (copper) seed layer is formed on the barrier metal film by, for example, a sputtering method or a CVD method, and further a Cu (copper) plated film is formed on the seed layer using an electrolytic plating method. In addition, the Cu (copper) plated film is embedded into the wiring groove TC. Next, the Cu (copper) plated film, the seed layer, and the barrier metal film other than the inside of the wiring groove TC are removed by, for example, a CMP method to form the first-layer wiring M1 made of Cu (copper) as a main conductive material.

Further, another wiring is formed on the first-layer wiring M1, and thus the semiconductor device according to the first embodiment is nearly completed.

<Effect by Segregation of Nitrogen>

Figure 13:
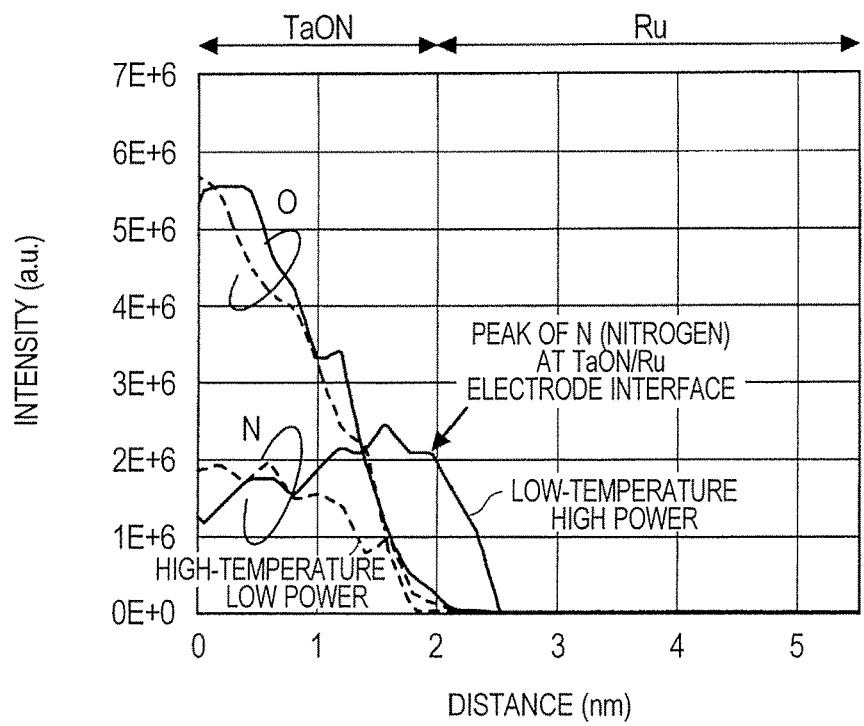
FIG. 13 is a graph for showing a detection intensity profile of N (nitrogen) and O (oxygen) near the interface between a lower electrode and the resistance change layer.

FIG. 13 is a graph for showing a detection intensity profile of N (nitrogen) and O (oxygen) near the interface (hereinafter, simply referred to as a TaON/Ru electrode interface in the first embodiment) between an Ru film of an Ru/Ta laminated film configuring the lower electrode and a TaON (tantalum oxynitride) film configuring the resistance change layer. FIG. 13 shows a detection intensity profile of the TaON (tantalum oxynitride) film formed in each of two plasma oxidation conditions that are different from each other. In one condition, the temperature is high (350° C.) and the power is low (800 W). In the other condition, the temperature is low (250° C.) and the power is high (1,000 W).

As shown in FIG. 13, the peak of N (nitrogen) can be confirmed at the TaON/Ru electrode interface in the low temperature and high power conditions. On the contrary, the peak of N (nitrogen) cannot be confirmed at the TaON/Ru electrode interface in the high temperature and low power conditions.

Details of the mechanism of segregation of nitrogen at the TaON/Ru electrode interface in the low temperature and high power conditions are not clear, but can be assumed as follows.

It is conceivable that $N_2O$ (nitrous oxide) is dissociated into $N_2$, N, NO, $O_2$, and O in $N_2O$ (nitrous oxide) plasma, and oxynitriding of Ta (tantalum) is progressed by the radical types and ion types thereof. In the low temperature and high power conditions, there is a possibility that the N (nitrogen) radicals had a numerical advantage over the O (oxygen) radicals due to the dissociation of $N_2O$ into (NO+ N), the N (nitrogen) radicals having energy were implanted into the Ta (tantalum) film, and nitriding of Ta (tantalum) was preferentially performed. On the other hand, in the high temperature and low power conditions, there is a possibility that oxidation of thermally-stable Ta (tantalum) was further promoted, and a nitriding reaction was suppressed.

Figure 14:
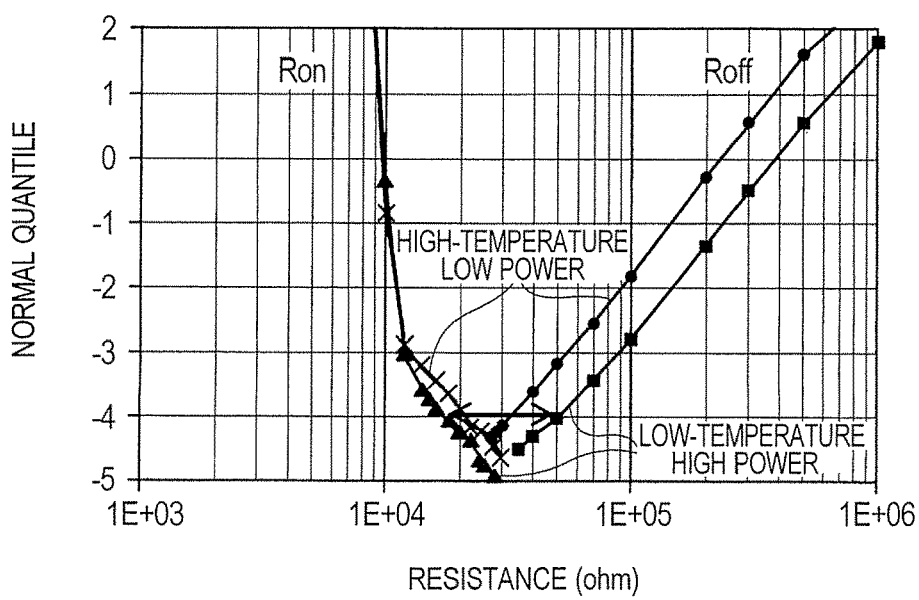
FIG. 14 is a lognormal probability distribution map of On-resistance and Off-resistance of a 2M-bit memory cell array.

FIG. 14 is a lognormal probability distribution map of the On-resistance and Off-resistance of a 2M-bit memory cell array. FIG. 14 shows lognormal probability distribution of the TaON (tantalum oxynitride) film formed in each of two plasma oxidation conditions that are different from each other. In one condition, the temperature is high (350° C.) and the power is low (800 W). In the other condition, the temperature is low (250° C.) and the power is high (1,000 W). Further, unit cells are arranged in matrix in the 2M-bit memory cell array, and each unit cell is configured using a combination of the resistance change element formed by the above-described manufacturing process and the selection transistor.

As shown in FIG. 14, in the low temperature and high power conditions in which segregation of nitrogen can be observed at the TaON/Ru electrode interface, the resistance ratio (memory window) of the On-resistance to the Off-resistance is increased.

Figure 15A:
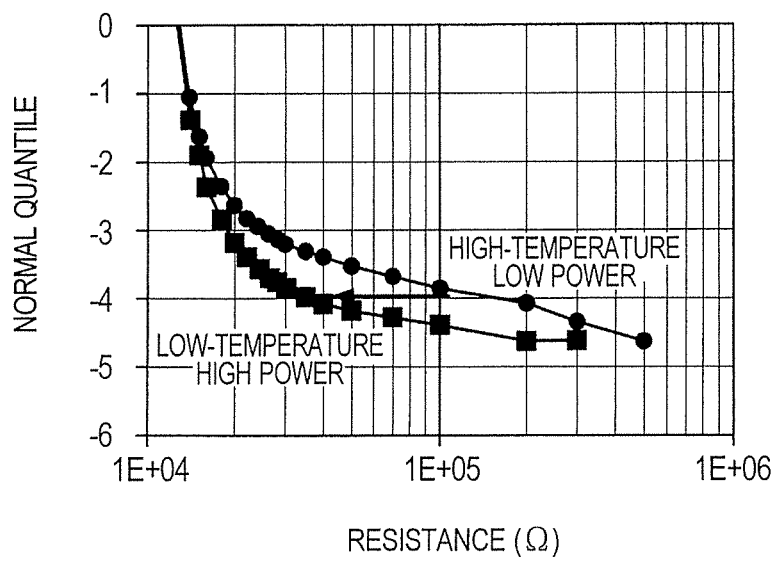
FIGS. 15A and 15B are graphs each showing holding resistance at 200° C. in a low resistance (On) state measured using the 2M-bit memory cell array.
Figure 15B:
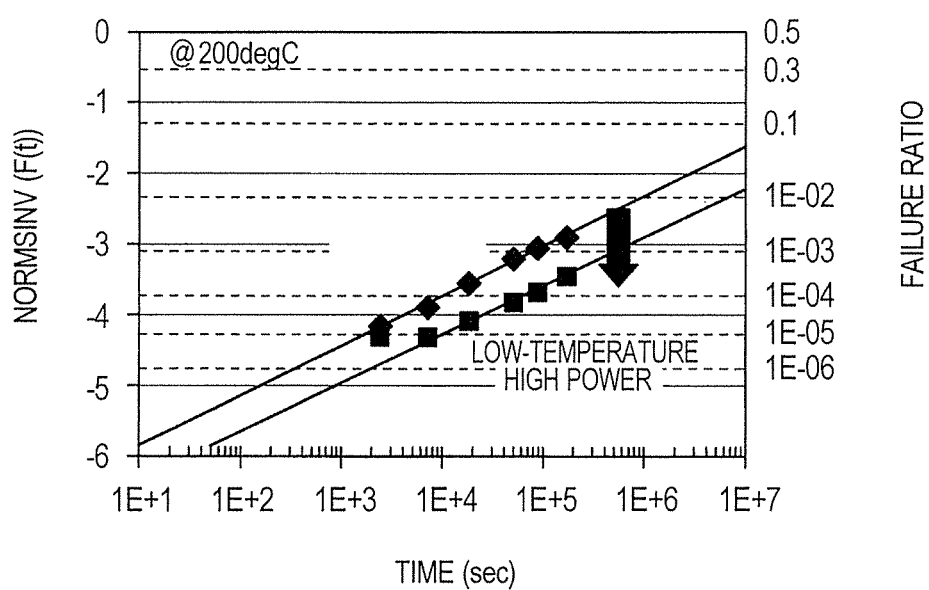

FIGS. 15A and 15B are graphs each showing holding resistance at 200° C. in the low resistance (On) state measured using the 2M-bit memory array. FIG. 15A is a graph for showing distribution of the On-resistance after being held at 200° C. FIG. 15B is a graph for showing the holding time dependence of an On holding failure ratio at 200° C. when assuming that 30 kΩ or larger is defined as a failure.

As shown in FIGS. 15A and 15B, the On-resistance is suppressed from being increased after being held at 200° C. and the On holding failure ratio is decreased in the low temperature and high power conditions in which the segregation of nitrogen can be observed at the TaON/Ru electrode interface as compared to the high temperature and low power conditions in which the segregation of nitrogen cannot be observed at the TaON/Ru electrode interface.

As described above, the inventors found that the structure in which nitrogen is segregated at the TaON/Ru electrode interface can realize both of securing of the memory window of the resistance change element and improvement in the holding resistance of the low resistance (On) state. As a result of study by the inventors, the peak of the concentration of N (nitrogen) at the TaON/Ru electrode interface could be confirmed in the plasma oxidation conditions in which the temperature was 200° C. or higher and 300° C. or lower and the power was 1,000 W or higher.

Figure 16A:
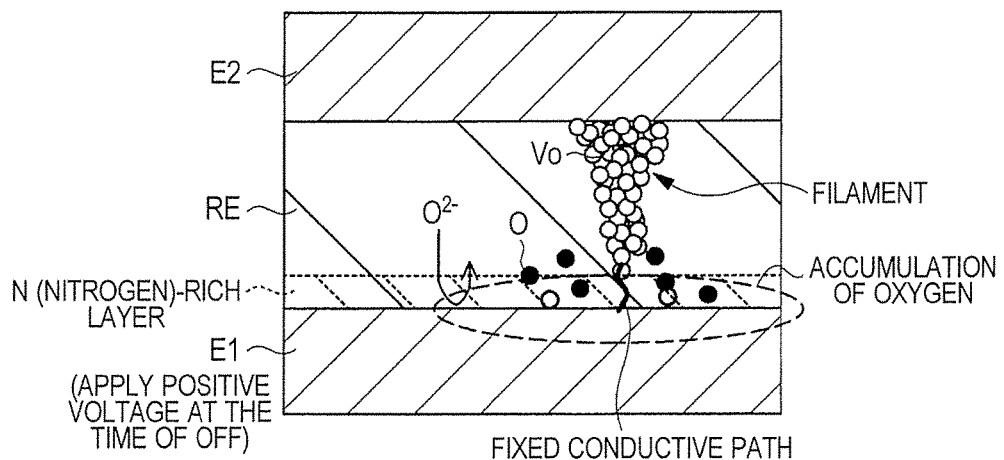
FIG. 16A shows a schematic view of the resistance change element in which N (nitrogen) is segregated at the interface between the lower electrode and the resistance change layer.
Figure 16B:
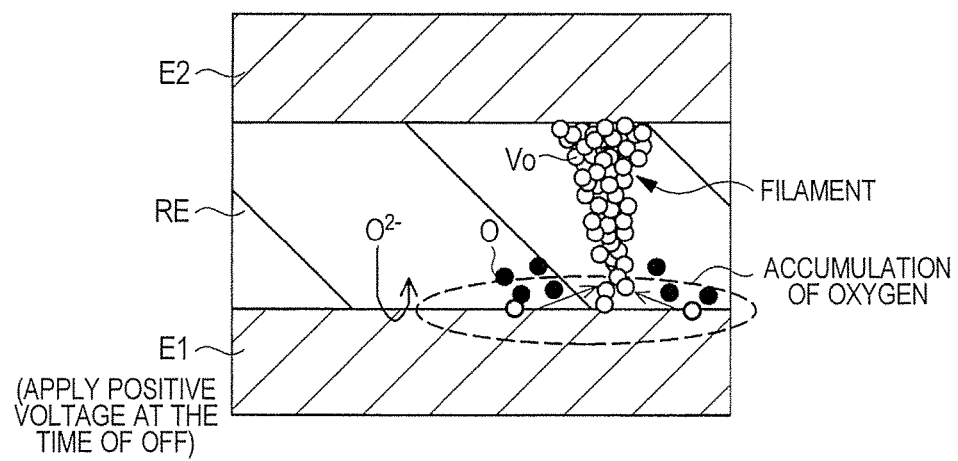
FIG. 16B shows a schematic view of the resistance change element in which N (nitrogen) is not segregated at the interface between the lower electrode and the resistance change layer.

Next, the mechanism of an improved effect of the holding resistance of the low resistance (On) state by the segregation of nitrogen will be studied using FIGS. 16A and 16B. FIG. 16A shows a schematic view of the resistance change element in which N (nitrogen) is segregated at the TaON/Ru electrode interface. FIG. 16B shows a schematic view of the resistance change element in which N (nitrogen) is not segregated at the TaON/Ru electrode interface. In each drawing, E1 denotes a lower electrode to which a positive voltage is applied when being transited to the high resistance (Off) state, RE denotes a resistance change layer, and E2 denotes an upper electrode facing the lower electrode while sandwiching the resistance change layer.

In the case of the structure in which nitrogen is not segregated (FIG. 16B), O (oxygen) is likely to be accumulated at the TaON/Ru electrode interface to which a positive voltage is applied when being transited to the high resistance (Off) state because the drift effect in which O (oxygen) ions are attracted to the lower electrode E1 is exerted, and further Ru (ruthenium) is metal that is hardly oxidized. In addition, it is conceivable that O (oxygen) accumulated at the TaON/Ru electrode interface reacts with the oxygen deficiency Vo of the filament when the high temperature is held, so that the filament is made thinner and the holding resistance of the low resistance (On) state is deteriorated.

On the other hand, in the case of the structure in which nitrogen is segregated (FIG. 16A), it can be assumed that N (nitrogen) in the TaON (tantalum oxynitride) film forms electron potential, so that a stable fixed conductive path that is not involved in switching is formed in an N (nitrogen) rich layer in the TaON (tantalum oxynitride) film at the TaON/Ru electrode interface. Therefore, it is conceivable that the switching position is apart from the lower electrode E1 in which O (oxygen) is accumulated, and is hardly affected by the shrink of the filament due to O (oxygen), leading to stabilization of the holding resistance of the low resistance (On) state.

Further, a region where the concentration of N (nitrogen) is high is limited to near the lower electrode E1, and thus the conductive path through the electron potential of N (nitrogen) to couple the lower electrode E1 to the upper electrode E2 is not formed. Therefore, it is possible to keep the high resistance even in the high resistance (Off) state. Thus, it is possible to improve the holding resistance of the low resistance (On) state while keeping the memory window.

As described above, the resistance change layer RE is configured using an oxide of transition metal containing N (nitrogen), for example, a TaOx (tantalum oxide) film containing N (nitrogen) in the first embodiment, and the concentration of N (nitrogen) at the interface between the lower electrode E1 to which a positive voltage is applied when being transited to the high resistance (OFF) state and the resistance change layer RE is more increased than that at the interface between the upper electrode E2 facing the lower electrode E1 and the resistance change layer RE. Accordingly, the resistance change element that is high in the holding resistance of the low resistance (On) state can be realized while securing the memory window.

(Second Embodiment)

A second embodiment is different from the above-described first embodiment in that a conductive layer is formed on a lower electrode. The other configurations are the same or substantially the same as the resistance change element according to the above-described first embodiment, and thus the detailed explanations thereof will be omitted.

<Configuration of Resistance Change Element>

Figure 17:
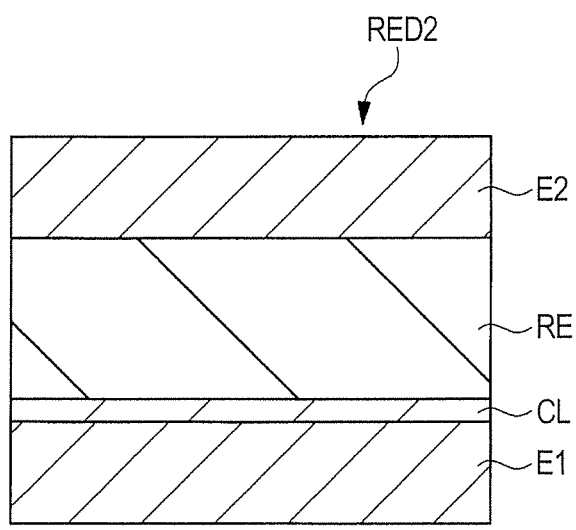
FIG. 17 is a cross-sectional view of main parts obtained by enlarging a part of a resistance change element according to a second embodiment.

A configuration of a resistance change element according to the second embodiment will be described using FIG. 17. FIG. 17 is a cross-sectional view of main parts obtained by enlarging a part of the resistance change element according to the second embodiment.

As shown in FIG. 17, a resistance change element RED2 is mainly configured using a lower electrode E1 to which a positive voltage is applied when being transited to the high resistance (Off) state, a resistance change layer RE, and an upper electrode E2. In addition, a conductive layer CL configured using a nitride made of transition metal (for example, Ta (tantalum), Hf (hafnium), Al (aluminum), Ni (nickel), Ti (titanium), W (tungsten), or the like) configuring the resistance change layer RE is formed between the lower electrode E1 and the resistance change layer RE.

In the case where a TaOx (tantalum oxide) film containing, for example, N (nitrogen) is used for the resistance change layer RE, the conductive layer CL made of TaN (tantalum nitride) that is a nitride of Ta (tantalum) is formed. The thickness of the conductive layer CL is thinner than that of the resistance change layer RE. The thickness of the resistance change layer RE is, for example, about 3 nm, and the thickness of the conductive layer CL is, for example, about 0.5 nm to 1.5 nm.

As described above, in the second embodiment, the conductive layer CL configured using a nitride made of transition metal configuring the resistance change layer RE is formed between the lower electrode E1 to which a positive voltage is applied when being transited to the high resistance (Off) state and the resistance change layer RE. The conductive layer CL can function as a stable conductive layer that is not involved in switching and an oxygen absorption layer. Thus, it is conceivable that the holding resistance of the low resistance (On) state of a filament formed in the resistance change layer RE is stabilized.

<Manufacturing Method of Resistance Change Element>

A manufacturing method of the resistance change layer and the conductive layer configured using a nitride made of transition metal configuring the resistance change layer according to the second embodiment will be described using FIG. 17.

(1) First Manufacturing Method

First, the lower electrode E1 made of, for example, precious metal (for example, Ru (ruthenium)) is formed.

Next, for example, a TaN (tantalum nitride) film is formed on the lower electrode E1 by, for example, a sputtering method. The thickness of the TaN (tantalum nitride) film is, for example, about 1.5 nm.

Next, while a part of the TaN (tantalum nitride) film is left on the lower electrode E1 side, the other part of the TaN (tantalum nitride) film is changed to a TaOx (tantalum oxide) film containing N (nitrogen) by plasma oxidation using oxidation gas such as $N_2O$ (nitrous oxide) gas, NO (nitric oxide) gas, $O_2$ (oxygen) gas, $O_3$ (ozone) gas, or the like. The remaining TaN (tantalum nitride) film functions as the conductive layer CL, and the TaOx (tantalum oxide) film containing N (nitrogen) functions as the resistance change layer RE.

Thereafter, the upper electrode E2 made of, for example, W (tungsten) is formed on the resistance change layer RE.

(2) Second Manufacturing Method

First, the lower electrode E1 made of, for example, precious metal (for example, Ru (ruthenium)) is formed.

Next, a TaN (tantalum nitride) film serving as, for example, the conductive layer CL is formed on the lower electrode E1 by, for example, a sputtering method. The thickness of the TaN (tantalum nitride) film is, for example, about 0.5 nm to 1 nm. Next, a TaOx (tantalum oxide) film containing N (nitrogen) serving as, for example, the resistance change layer RE is formed on the TaN (tantalum nitride) film by, for example, a reactive sputtering method. As reactive gas used in the reactive sputtering method, for example, $N_2O$ (nitrous oxide) gas, NO (nitric oxide) gas, $NH_3$ (ammonia) gas, or the like is used. The thickness of the TaOx (tantalum oxide) film containing N (nitrogen) is, for example, about 3 nm.

Thereafter, the upper electrode E2 made of, for example, W (tungsten) is formed on the resistance change layer RE.

(Third Embodiment)

A third embodiment is different from the above-described first embodiment in that a resistance change element is formed on a first-layer wiring. The other configurations are the same or substantially the same as the semiconductor device according to the above-described first embodiment, and thus the detailed explanations thereof will be omitted.

<Configuration of Semiconductor Device>

Figure 18:
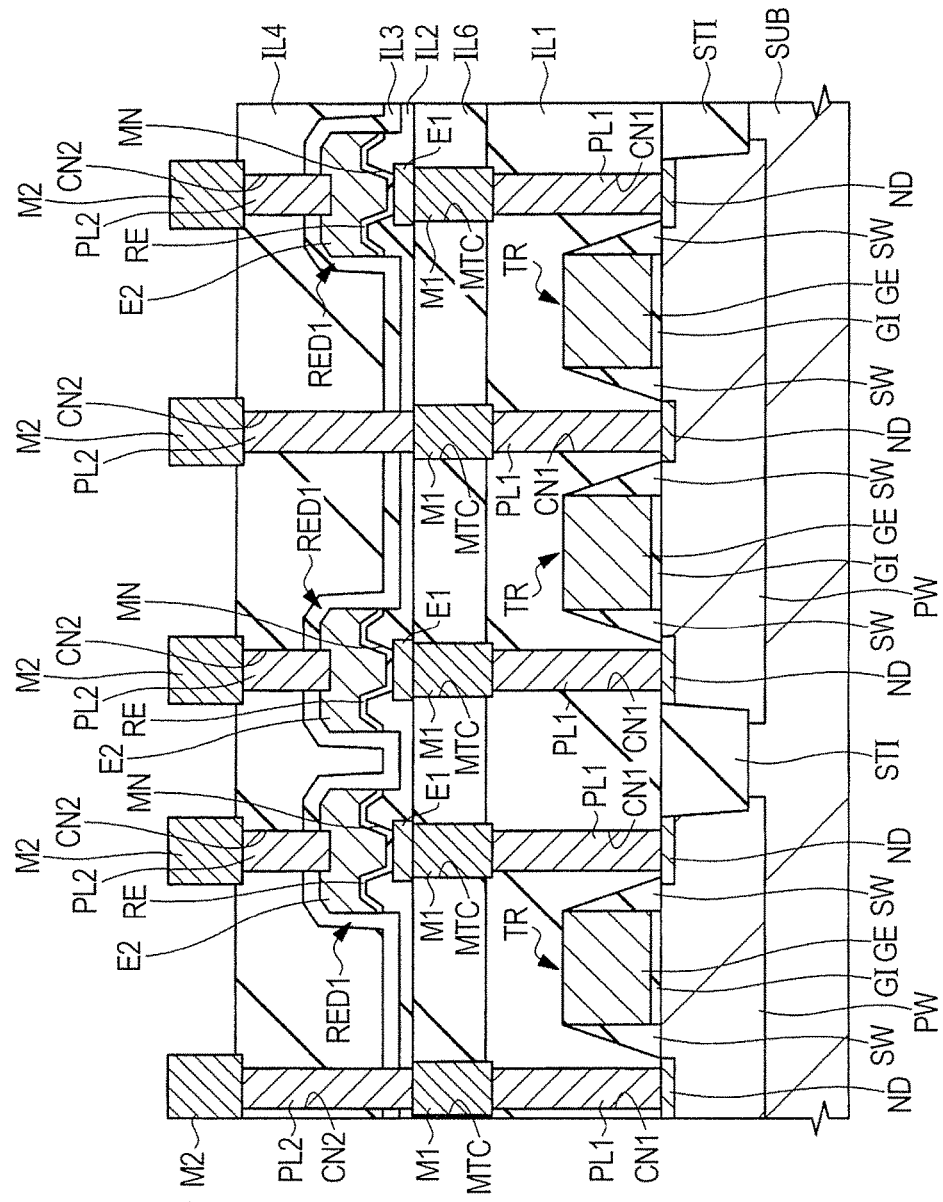
FIG. 18 is a cross-sectional view of main parts for showing a semiconductor device having a resistance change element according to a third embodiment.

A configuration of a semiconductor device having a resistance change element according to the third embodiment will be described using FIG. 18. FIG. 18 is a cross-sectional view of main parts for showing the semiconductor device having the resistance change element according to the third embodiment. In this case, a memory cell is exemplified using a combination of one resistance change element and one semiconductor device as a unit cell. Further, for example, an n-channel MOSFET is exemplified as a selection transistor in the semiconductor device.

A selection transistor TR is covered with an insulating film IL1. A contact hole CN1 that vertically penetrates the insulating film IL1 to reach a necessary part such as an n-type semiconductor region ND is formed, and a plug PL1 made of, for example, W (tungsten) as a main conductive material is formed in the contact hole CN1.

An insulating film IL6 is formed on the insulating film ILL and a first-layer wiring M1 is formed in a concave wiring groove MTC formed in the insulating film IL6. The first-layer wiring M1 is electrically coupled to the plug PL1, and is made of, for example, Cu (copper), Al (aluminum), W (tungsten), or the like.

In addition, a lower electrode E1 is formed while being coupled to the first-layer wiring M1 that is electrically coupled to one n-type semiconductor region ND of the selection transistor TR through the plug PL1. The lower electrode E1 is configured using an Ru/Ta laminated film in which, for example, a Ta (tantalum) film is used for the lower layer and an Ru (ruthenium) film is used for the upper layer. The lower electrode E1 is covered with an insulating film IL2, and a memory hole MN that penetrates the insulating film IL2 to reach the lower electrode E1 is formed.

A resistance change layer RE is formed on the lower electrode E1, an upper electrode E2 is formed on the resistance change layer RE, and a resistance change element RED1 is configured using the lower electrode E1, the resistance change layer RE, and the upper electrode E2. The resistance change layer RE is formed in the inner wall (the side surfaces and the bottom surface) of the memory hole MN that is an opening of the insulating film IL2, and is in contact with the lower electrode E1 at the bottom surface of the memory hole MN. Further, the resistance change layer RE is formed so as to ride over the insulating film IL2 including the inner wall (the side surfaces and the bottom surface) of the memory hole MN.

In addition, the resistance change layer RE is configured using a TaOx (tantalum oxide) film containing, for example, N (nitrogen), and N (nitrogen) is segregated at the interface between the lower electrode E1 and the resistance change layer RE (see FIG. 2 and FIG. 3). The upper electrode E2 is configured using, for example, a W (tungsten) film. A TaN/Ta laminated film in which a Ta (tantalum) film is used for the lower layer and a TaN (tantalum nitride) film is used for the upper layer may be formed between the resistance change layer RE and the upper electrode E2.

The resistance change element RED1 is covered with a cover insulating film IL3 and an interlayer insulating film IL4. The cover insulating film IL3 is made of, for example, SiN (silicon nitride), SiON (silicon oxynitride), SiCN (carbon-containing silicon nitride), or the like, and the interlayer insulating film IL4 is made of, for example, $SiO_2$ (silicon oxide), SiOC (carbon-containing silicon oxide), or the like.

A contact hole CN2 that vertically penetrates the cover insulating film IL3 and the interlayer insulating film IL4 to reach the upper electrode E2 of the resistance change element RED1 is formed. Further, the contact hole CN2 that vertically penetrates the insulating film IL2, the cover insulating film IL3, and the interlayer insulating film IL4 to reach the first-layer wiring M1 that is electrically coupled to the other n-type semiconductor region ND of the selection transistor TR through the plug PL1 is formed.

A plug PL2 made of, for example, W (tungsten) as a main conductive material is formed in the contact hole CN2. A second-layer wiring M2 coupled to the plug PL2 is formed on the interlayer insulating film IL4. Further, another wiring (not shown) is formed on the second-layer wiring M2.

As described above, the first-layer wiring M1 is provided between the resistance change element RED1 and the n-type semiconductor region ND that functions as the source and drain of the selection transistor TR in the third embodiment. In the semiconductor device according to the third embodiment, the distance between the first-layer wiring M1 and the semiconductor substrate SUB is shortened as compared to the semiconductor device according to the first embodiment. Thus, the operation speeds of circuits in a region other than the memory cell array are increased. Further, the operation speeds of the circuits in the semiconductor device according to the third embodiment match those in a semiconductor device in which no resistance change element RED1 is mounted. Thus, the compatibility of circuit design in terms of the presence or absence of the resistance change element RED1 can be enhanced.

(Fourth Embodiment)

A fourth embodiment is different from the above-described first embodiment in that the position of a memory hole that couples a resistance change layer and a lower electrode of a resistance change element to each other and the position of a plug that electrically couples one n-type semiconductor region of a selection memory cell and the lower electrode of the resistance change element to each other are not overlapped with each other in plan view. The other configurations are the same or substantially the same as the semiconductor device according to the above-described first embodiment, and thus the detailed explanations thereof will be omitted.

<Configuration of Semiconductor Device>

Figure 19:
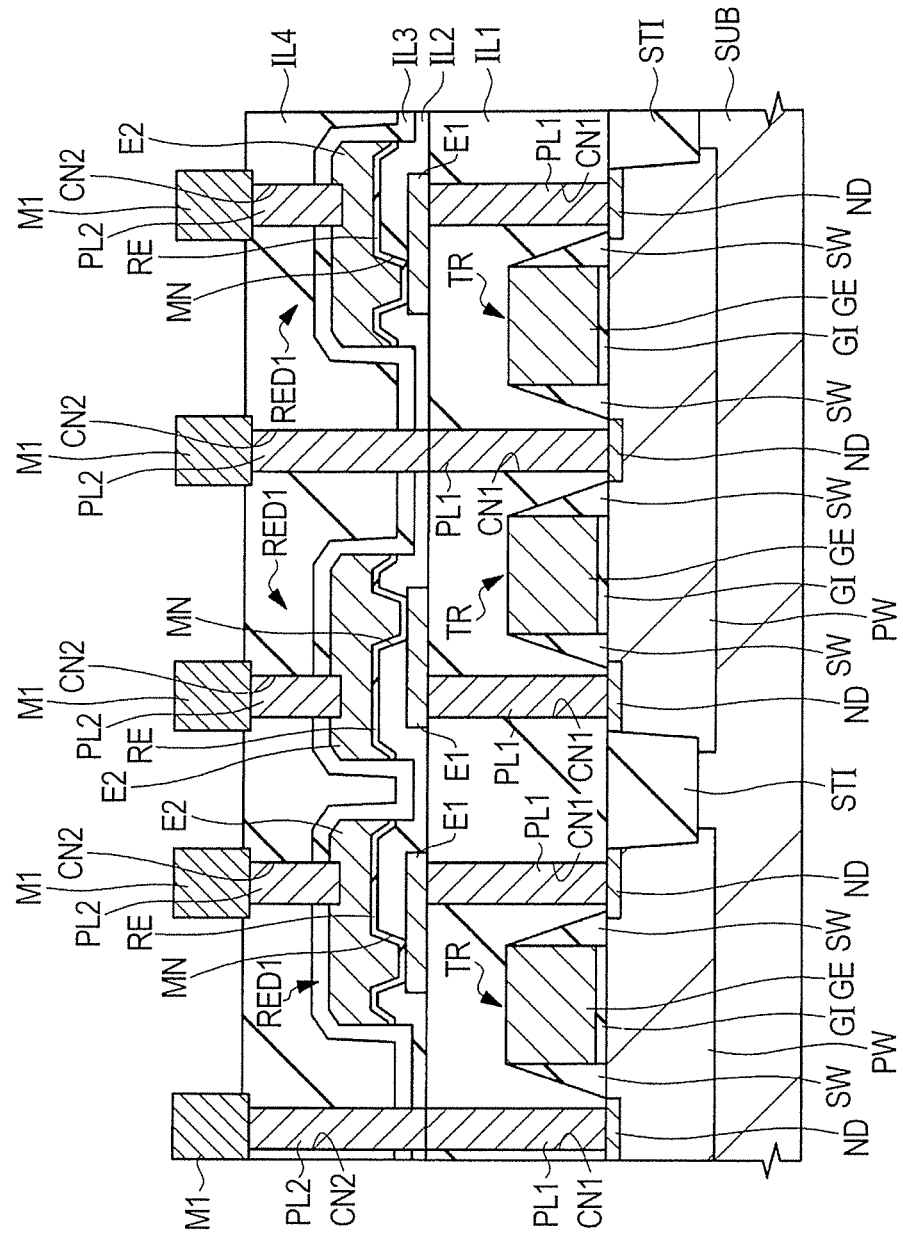
FIG. 19 is a cross-sectional view of main parts for showing a semiconductor device having a resistance change element according to a fourth embodiment.

A configuration of a semiconductor device having a resistance change element according to the fourth embodiment will be described using FIG. 19. FIG. 19 is a cross-sectional view of main parts for showing the semiconductor device having the resistance change element according to the fourth embodiment. In this case, a memory cell is exemplified using a combination of one resistance change element and one semiconductor device as a unit cell. Further, for example, an n-channel MOSFET is exemplified as a selection transistor in the semiconductor device.

A selection transistor TR is covered with an insulating film IL1. A contact hole CN1 that vertically penetrates the insulating film IL1 to reach a necessary part such as an n-type semiconductor region ND is formed, and a plug PL1 made of, for example, W (tungsten) as a main conductive material is formed in the contact hole CN1.

A lower electrode E1 that is electrically coupled to one n-type semiconductor region ND of the selection transistor TR through the plug PL1 is formed on the insulating film IL1. The lower electrode E1 is configured using an Ru/Ta laminated film in which, for example, a Ta (tantalum) film is used for the lower layer and an Ru (ruthenium) film is used for the upper layer. The lower electrode E1 is covered with an insulating film IL2, and a memory hole MN that penetrates the insulating film IL2 to reach the lower electrode E1 is formed. In this case, the memory hole MN is formed so that the memory hole MN and the plug PL1 are not overlapped with each other in plan view.

A resistance change layer RE is formed on the lower electrode E1, an upper electrode E2 is formed on the resistance change layer RE, and a resistance change element RED1 is configured using the lower electrode E1, the resistance change layer RE, and the upper electrode E2. The resistance change layer RE is formed in the inner wall (the side surfaces and the bottom surface) of the memory hole MN that is an opening of the insulating film IL2, and is in contact with the lower electrode E1 at the bottom surface of the memory hole MN. Further, the resistance change layer RE is formed so as to ride over the insulating film IL2 including the inner wall (the side surfaces and the bottom surface) of the memory hole MN.

In addition, the resistance change layer RE is configured using a TaOx (tantalum oxide) film containing, for example, N (nitrogen), and N (nitrogen) is segregated at the interface between the lower electrode E1 and the resistance change layer RE (see FIG. 2 and FIG. 3). The upper electrode E2 is configured using, for example, a W (tungsten) film. A TaN/Ta laminated film in which a Ta (tantalum) film is used for the lower layer and a TaN (tantalum nitride) film is used for the upper layer may be formed between the resistance change layer RE and the upper electrode E2.

The resistance change element RED1 is covered with a cover insulating film IL3 and an interlayer insulating film IL4. The cover insulating film IL3 is made of, for example, SiN (silicon nitride), SiON (silicon oxynitride), SiCN (carbon-containing silicon nitride), or the like, and the interlayer insulating film IL4 is made of, for example, $SiO_2$ (silicon oxide), SiOC (carbon-containing silicon oxide), or the like.

A contact hole CN2 that vertically penetrates the cover insulating film IL3 and the interlayer insulating film IL4 to reach the upper electrode E2 of the resistance change element RED1 is formed. In this case, the contact hole CN2 is formed so that the memory hole MN and the contact hole CN2 are not overlapped with each other in plan view. Further, the contact hole CN2 that vertically penetrates the insulating film IL2, the cover insulating film IL3, and the interlayer insulating film IL4 to reach the plug PL1 that is electrically coupled to the other n-type semiconductor region ND of the selection transistor TR is formed.

A plug PL2 made of, for example, W (tungsten) as a main conductive material is formed in the contact hole CN2. A first-layer wiring M1 coupled to the plug PL2 is formed on the interlayer insulating film IL4. Further, another wiring (not shown) is formed on the first-layer wiring M1.

As described above, in the fourth embodiment, the position of the memory hole MN that couples the resistance change layer RE and the lower electrode E1 of the resistance change element RED1 to each other and the position of the plug PL1 that electrically couples one n-type semiconductor region ND of the selection transistor TR and the lower electrode E1 of the resistance change element RED1 to each other are not overlapped with each other in plan view. Accordingly, the resistance change element RED1 is hardly affected by steps caused by the plug PL1 such as seams of the plug PL1, and the stable operation and high reliability of the resistance change element RED1 can be realized.

The invention achieved by the inventors has been described above in detail on the basis of the embodiments. However, it is obvious that the present invention is not limited to the embodiments, but can be variously changed without departing from the scope of the invention.

The present invention includes, as least, the following embodiments.

[Additional Statement 1]

A wireless terminal having a sensor, radio waves, a micro controller unit, and a power source, wherein the micro controller unit includes a resistance random access memory in which transistors and resistance change elements that are coupled in series to the transistors are arranged in matrix over a semiconductor substrate, wherein the resistance change element is configured using a first electrode that applies a positive voltage when being transited from a low resistance state to a high resistance state, a second electrode that faces the first electrode, and a resistance change layer that is sandwiched between the first electrode and the second electrode and is configured using an oxide of transition metal, wherein the resistance change layer contains nitrogen, and wherein the concentration of nitrogen on the first electrode side in the resistance change layer is higher than that on the second electrode side.

[Additional Statement 2]

The wireless terminal according to Additional Statement 1, wherein the nitrogen contained in the resistance change layer exhibits a concentration gradient that is continuously declined from the first electrode side to the second electrode side.

[Additional Statement 3]

The wireless terminal according to Additional Statement 1, wherein the nitrogen is segregated at the interface between the first electrode and the resistance change layer.

[Additional Statement 4]

The wireless terminal according to Additional Statement 1, wherein the concentration of nitrogen contained in the resistance change layer is 3 atomic % or larger and smaller than 20 atomic %.

[Additional Statement 5]

The wireless terminal according to Additional Statement 1, wherein a conductive layer configured using a nitride of the transition metal that forms the resistance change layer is provided between the first electrode and the resistance change layer.

What is claimed is:

1. A semiconductor device comprising a resistance random access memory in which transistors and resistance change elements that are coupled in series to the transistors are arranged over a semiconductor substrate, wherein the resistance change element comprises a first electrode that applies a positive voltage when being transited from a low resistance state to a high resistance state, a second electrode that faces the first electrode, and a resistance change layer that is sandwiched between the first electrode and the second electrode and comprises an oxide of transition metal, wherein the resistance change layer contains nitrogen, and wherein the concentration of nitrogen on the first electrode side in the resistance change layer is higher than that on the second electrode side, wherein the concentration of nitrogen contained in the resistance change layer continuously declines from the first electrode side to either: the second electrode side, or a distance from the first electrode side at which the concentration of nitrogen reaches approximately zero.

2. The semiconductor device according to claim 1, wherein the nitrogen is segregated at the interface between the first electrode and the resistance change layer.

3. The semiconductor device according to claim 1, wherein the concentration of nitrogen contained in the resistance change layer is 3 atomic % or larger and smaller than 20 atomic %.

4. The semiconductor device according to claim 1, wherein a conductive layer comprises a nitride of the transition metal that forms the resistance change layer is provided between the first electrode and the resistance change layer.

5. The semiconductor device according to claim 1, wherein the transition metal is Ta, Hf, Al, Ni, Ti, or W.

6. The semiconductor device according to claim 1, wherein the first electrode is made of one or more of Ru, Pt, Ir, Au, and Pd.

7. The semiconductor device according to claim 1, wherein the resistance change layer is made of TaOx ($0 < x \leq 2.5$) containing nitrogen.

8. The semiconductor device according to claim 7, wherein a Ta film in contact with the resistance change layer and a TaN film in contact with the second electrode are provided between the resistance change layer and the second electrode.

9. The semiconductor device according to claim 1, wherein the transistor comprises:

a gate insulating film that is formed over the semiconductor substrate;

a gate electrode that is formed over the gate insulating film;

a first semiconductor region and a second semiconductor region that are formed in the semiconductor substrate on respective sides of the gate electrode;

a first insulating film that is formed over the semiconductor substrate so as to cover the gate electrode;

a first coupling hole that penetrates the first insulating film to reach the first semiconductor region and a second coupling hole that penetrates the first insulating film to reach the second semiconductor region;

a first plug that is embedded in the first coupling hole and a second plug that is embedded in the second coupling hole; and a first wiring that is coupled to the first plug and a second wiring that is coupled to the second plug, and wherein the resistance change element is arranged over the first wiring, and the first wiring is electrically coupled to the first electrode.

10. A manufacturing method of a semiconductor device, comprising the steps of:
(a) forming transistors over a semiconductor substrate; and
(b) forming resistance change elements that are coupled in series to the transistors,
wherein the step (a) further includes the steps of:
(a1) forming a gate insulating film over the semiconductor substrate;
(a2) forming a gate electrode over the gate insulating film; and
(a3) forming a first semiconductor region and a second semiconductor region in the semiconductor substrate on respective sides of a gate electrode,
wherein the step (b) further includes the steps of:
(b1) forming a first electrode that is electrically coupled to the first semiconductor region of the transistor;
(b2) forming a first layer made of transition metal over the first electrode;
(b3) forming a resistance change layer comprising an oxide of transition metal containing nitrogen by performing plasma oxidation using $N_2O$ gas for the first layer; and
(b4) forming a second electrode over the resistance change layer, and
wherein the temperature of the plasma oxidation is 20° C. or higher and 300° C. or lower, and the power of the plasma oxidation is 1,000 W or higher, and
wherein the concentration of nitrogen contained in the resistance change layer continuously declines from the first electrode side to either: the second electrode side, or a distance from the first electrode side at which the concentration of nitrogen reaches approximately zero.

11. A manufacturing method of a semiconductor device comprising the steps of:
(a) forming transistors over a semiconductor substrate; and
(b) forming resistance change elements that are coupled in series to the transistors,
wherein the step (a) further includes the steps of:
(a1) forming a gate insulating film over the semiconductor substrate;
(a2) forming a gate electrode over the gate insulating film; and
(a3) forming a first semiconductor region and a second semiconductor region in the respective semiconductor substrates on the both sides of the gate electrode,
wherein the step (b) further includes the steps of:
(b1) forming a first electrode that is electrically coupled to the first semiconductor region of the transistor;
(b2) forming a conductive layer comprising a nitride of transition metal over the first electrode and forming a resistance change layer comprising an oxide of the transition metal containing nitrogen over the conductive layer; and
(b3) forming a second electrode over the resistance change layer,
wherein the thickness of the resistance change layer is larger than that of the conductive layer.

12. The manufacturing method of a semiconductor device according to claim 11,
wherein the step (b2) further includes the steps of:
(i) forming a first layer comprising a nitride of the transition metal over the first electrode; and
(ii) forming the resistance change layer at an upper layer part of the first layer by performing plasma oxidation using $N_2O$ gas, NO gas, $O_2$ gas, or $O_3$ gas for the first layer and forming the conductive layer comprising the first layer while leaving the first layer at a lower layer part of the first layer.

13. The manufacturing method of a semiconductor device according to claim 11,
wherein the step (b2) further includes the steps of:
(i) forming the conductive layer over the first electrode; and
(ii) forming the resistance change layer by performing a reactive sputtering method using $N_2O$ gas, NO gas, or $NH_3$ gas over the conductive layer.

14. The manufacturing method of a semiconductor device according to claim 10,
wherein the transition metal is Ta, Hf, Al, Ni, Ti, or W.

15. The manufacturing method of a semiconductor device according to claim 10,
wherein the first electrode is made of one or more of Ru, Pt, Ir, Au, and Pd.

16. The manufacturing method of a semiconductor device according to claim 11,
wherein the transition metal is Ta, Hf, Al, Ni, Ti, or W.

17. The manufacturing method of a semiconductor device according to claim 11,
wherein the first electrode is made of one or more of Ru, Pt, Ir, Au, and Pd.

18. A semiconductor device comprising a resistance random access memory in which transistors and resistance change elements that are coupled in series to the transistors are arranged over a semiconductor substrate,
wherein the resistance change element comprises a first electrode that applies a positive voltage when being transited from a low resistance state to a high resistance state, a second electrode that faces the first electrode, and a resistance change layer that is sandwiched between the first electrode and the second electrode and comprises an oxide of transition metal,
wherein the resistance change layer contains nitrogen, and
wherein the concentration of nitrogen on the first electrode side in the resistance change layer is higher than that on the second electrode side,
wherein a rate of change of the concentration of nitrogen contained in the resistance change layer continuously declines from the first electrode side to either: the second electrode side, or a distance from the first electrode side toward the second electrode side at which the concentration of nitrogen reaches approximately zero.

* * * * *